(12) United States Patent
Hagiwara et al.

(10) Patent No.: US 8,947,593 B2
(45) Date of Patent: *Feb. 3, 2015

(54) SOLID-STATE IMAGE SENSING APPARATUS AND ELECTRONIC APPARATUS TO IMPROVE IMAGE QUALITY OF AN IMAGE

(71) Applicant: Sony Corporation, Tokyo (JP)

(72) Inventors: Hiroki Hagiwara, Kanagawa (JP); Keiji Sasano, Tokyo (JP); Hiroaki Tanaka, Kanagawa (JP); Yuki Tuji, Kanagawa (JP); Tsuyoshi Watanabe, Kanagawa (JP); Koji Tsuchiya, Kanagawa (JP); Kenzo Tanaka, Kagoshima (JP); Takaya Wada, Miyazaki (JP); Noboru Kawabata, Kagoshima (JP); Hirokazu Yoshida, Kagoshima (JP); Hironori Yokoyama, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/244,522

(22) Filed: Apr. 3, 2014

(65) Prior Publication Data

US 2014/0218573 A1    Aug. 7, 2014

Related U.S. Application Data

(63) Continuation of application No. 13/530,746, filed on Jun. 22, 2012, now Pat. No. 8,711,280.

(30) Foreign Application Priority Data

Jul. 7, 2011    (JP) ................................ 2011-151173

(51) Int. Cl.
*H04N 5/225*    (2006.01)
*H04N 5/369*    (2011.01)
(Continued)

(52) U.S. Cl.
CPC ............. *H04N 5/369* (2013.01); *H04N 5/2253* (2013.01); *H01L 27/14618* (2013.01); *H05K 1/0206* (2013.01); *H05K 1/0207* (2013.01); *H05K 2201/10121* (2013.01)
USPC .............................. 348/374; 348/340; 438/75

(58) Field of Classification Search
USPC .......... 348/294, 311, 340, 374; 257/431–435; 438/48, 60, 73, 75
See application file for complete search history.

(56) References Cited

U.S. PATENT DOCUMENTS 7,167,376 B2    1/2007    Miyashita et al.
7,795,676 B2    9/2010    Mabuchi (Continued)

FOREIGN PATENT DOCUMENTS

JP    3417225    4/2003
JP    2010-238821    10/2010

*Primary Examiner* — Kelly L Jerabek
(74) *Attorney, Agent, or Firm* — Oblon, Spivak, McClelland, Maier & Neustadt, L.L.P.

(57) ABSTRACT

A solid-state image sensing apparatus includes a solid-state image sensing device, signal processing circuit device, and a multi-layer wiring package. The solid-state image sensing device has a pixel in an image sensing area thereof. The pixel receives incident light and generate a signal electric charge. The signal processing circuit device is arranged to face the image sensing area and applies signal processing to a signal output from the solid-state image sensing device. The multi-layer wiring package has wiring layers, the solid-state image sensing device, and the signal processing circuit device. Each of the wiring layers is laminated via an insulator. The multi-layer wiring package is formed such that a first wiring layer provided between the solid-state image sensing device and the signal processing circuit device has a greater thickness than second wiring layers and has heat conductivity higher than or equal to heat conductivity of the second wiring layers.

18 Claims, 24 Drawing Sheets

(51) Int. Cl.
*H01L 27/146* (2006.01)
*H01L 21/00* (2006.01)
*H05K 1/02* (2006.01)

(56) References Cited

U.S. PATENT DOCUMENTS

| | | | |
|---|---|---|---|
| 8,030,720 B2 | 10/2011 | Mabuchi | |
| 8,098,309 B2 | 1/2012 | Takagi et al. | |
| 8,188,522 B2 | 5/2012 | Mabuchi | |
| 8,198,694 B2 | 6/2012 | Mabuchi | |
| 8,198,695 B2 | 6/2012 | Mabuchi | |
| 8,564,702 B2 | 10/2013 | Takagi et al. | |
| 8,711,280 B2 * | 4/2014 | Hagiwara et al. | 348/374 |
| 2004/0080037 A1 | 4/2004 | Foong et al. | |
| 2005/0116138 A1 | 6/2005 | Hanada et al. | |
| 2007/0235828 A1 * | 10/2007 | Yoshihara et al. | 257/432 |
| 2010/0053388 A1 | 3/2010 | Kobayashi et al. | |
| 2012/0008025 A1 | 1/2012 | Sasano et al. | |

* cited by examiner

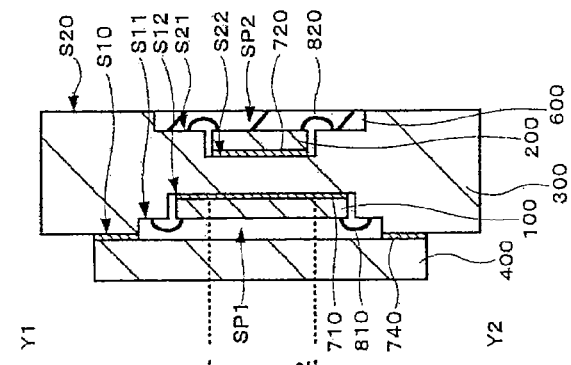
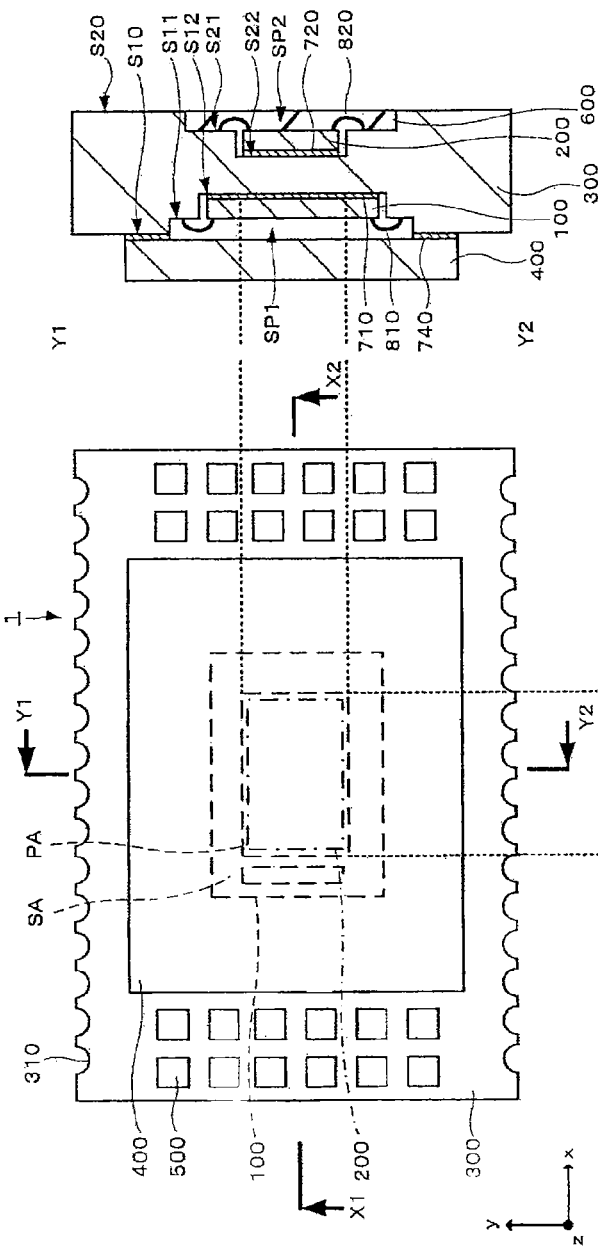
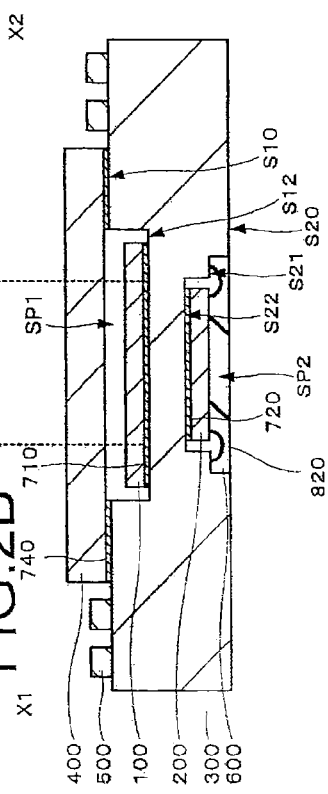

FIG.4
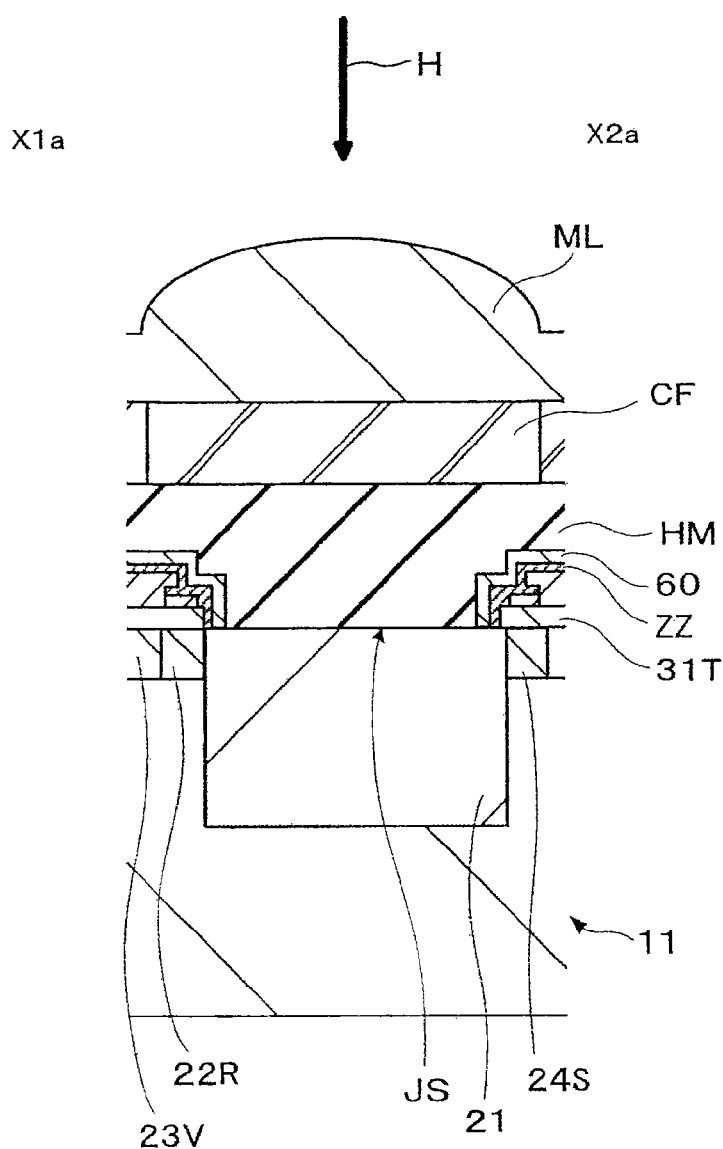
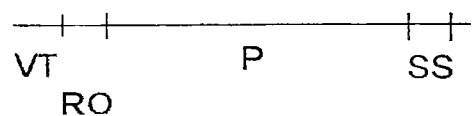
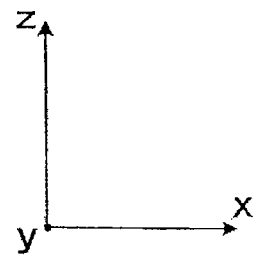

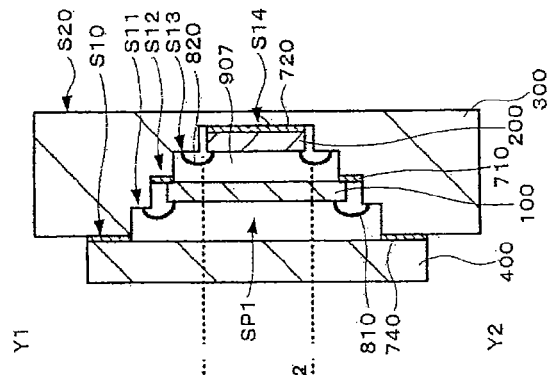
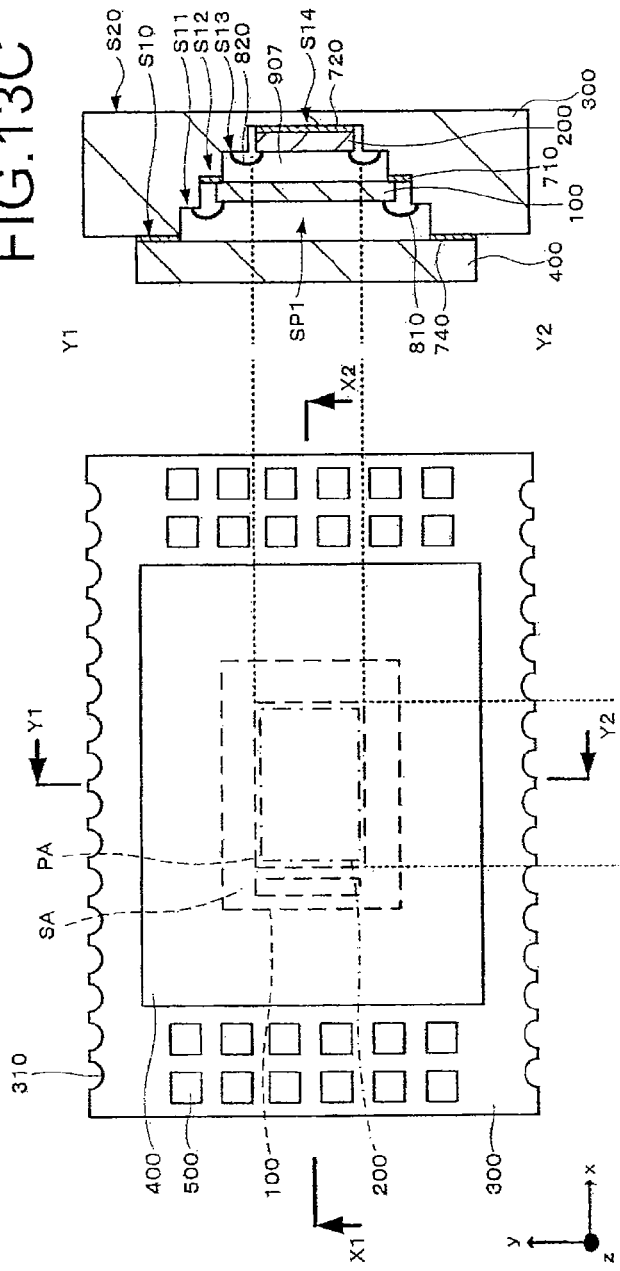
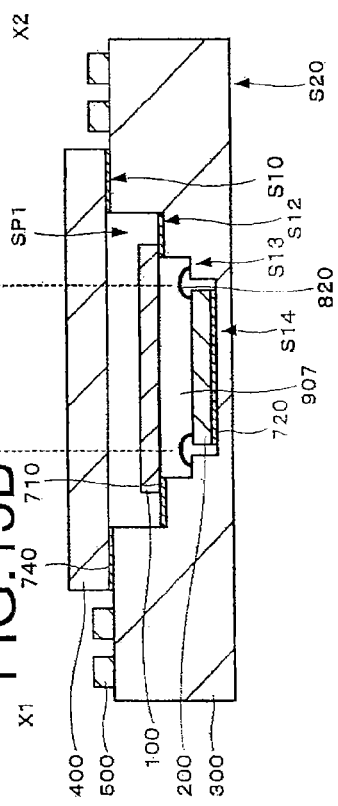

SOLID-STATE IMAGE SENSING APPARATUS AND ELECTRONIC APPARATUS TO IMPROVE IMAGE QUALITY OF AN IMAGE

CROSS-REFERENCE TO RELATED APPLICATIONS

This application is a continuation of U.S. application Ser. No. 13/530,746, filed Jun. 22, 2012, the entire content of which is incorporated herein by reference, and claims priority under 35 U.S.C. 119 to Japanese Application No. 2011-151173 filed Jul. 7, 2011.

BACKGROUND

The present disclosure relates to a solid-state image sensing apparatus and an electronic apparatus.

Electronic apparatuses such as digital still cameras and digital video cameras include a solid-state image sensing apparatus. The solid-state image sensing apparatus includes an image sensor chip in which an image sensing area having a plurality of pixels in matrix form is provided on the surface of a semiconductor substrate. Examples of the image sensor chip include, for example, CCD (Charge Coupled Device) image sensor chips and CMOS (Complementary Metal Oxide Semiconductor) image sensor chips.

In the image sensor chip, each of the plurality of pixels has a photoelectric conversion part. The photoelectric conversion part is, for example, a photodiode that receives light incident via an external optical system at its light receiving surface and photoelectrically converts the same to generate signal electric charges. Then, the solid-state image sensing apparatus applies signal processing to an output signal output from the image sensor chip.

Meanwhile, there is a demand for downsizing of solid-state image sensing apparatuses. To this end, there has been proposed a solid-state image sensing apparatus in which both an image sensor chip and a signal processing chip that applies signal processing to an output signal are mounted in the same multi-layer wiring package (see, for example, Japanese Patent No. 3417225 (FIG. 1, etc.) and Japanese Patent Laid-open No. 2010-238821 (FIG. 2, etc.)).

SUMMARY

In the above solid-state image sensing apparatus, however, it may be difficult to improve various properties such as image quality of a captured image.

The present disclosure has been made in view of the above circumstances, and it is therefore desirable to provide a solid-state image sensing apparatus and an electronic apparatus that are capable of improving various properties such as image quality of a captured image.

A solid-state image sensing apparatus and an electronic apparatus according to an embodiment of the present disclosure each include a solid-state image sensing device, a signal processing circuit device, and a multi-layer wiring package. The solid-state image sensing device has a pixel in an image sensing area thereof. The pixel is configured to receive incident light and generate a signal electric charge. The signal processing circuit device is arranged to face the image sensing area of the solid-state image sensing device and configured to apply signal processing to a signal output from the solid-state image sensing device. The multi-layer wiring package has a plurality of wiring layers provided therein and has the solid-state image sensing device and the signal processing circuit device provided therein. Each of the plurality of the wiring layers is laminated via an insulator. The multi-layer wiring package is formed such that a first wiring layer provided between the solid-state image sensing device and the signal processing circuit device among the plurality of wiring layers has a greater thickness than second wiring layers other than the first wiring layer, and the first wiring layer has heat conductivity higher than or equal to heat conductivity of the second wiring layers.

A solid-state image sensing apparatus and an electronic apparatus according to another embodiment of the present disclosure each include a solid-state image sensing device, a signal processing circuit device, and a multi-layer wiring package. The solid-state image sensing device has a pixel in an image sensing area thereof. The pixel is configured to receive incident light and generate a signal electric charge. The signal processing circuit device is arranged to face the image sensing area of the solid-state image sensing device and configured to apply signal processing to a signal output from the solid-state image sensing device. The multi-layer wiring package has a plurality of wiring layers provided therein and has the solid-state image sensing device and the signal processing circuit device provided therein. Each of the plurality of the wiring layers is laminated via an insulator. The multi-layer wiring package is formed such that a first wiring layer provided between the solid-state image sensing device and the signal processing circuit device among the plurality of wiring layers has a thickness greater than or equal to a thickness of second wiring layers other than the first wiring layer, and the first wiring layer has higher heat conductivity than the second wiring layers.

In the solid-state image sensing apparatus and the electronic apparatus according to the embodiments of the present disclosure, heat generated at the solid-state image sensing device or the signal processing circuit device is transmitted to the first wiring layer provided between the solid-state image sensing device and the signal processing circuit device and radiated to an outside. Therefore, it is possible to reduce the heat transmitted to the image sensing area of the solid-state image sensing device and reduce the occurrence of a dark current.

According to an embodiment of the present disclosure, it is possible to provide a solid-state image sensing apparatus and an electronic apparatus that are capable of improving various properties such as image quality of a captured image.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 2A to 2C are views showing the configuration of a solid-state image sensing apparatus according to the first embodiment;

FIG. 4 is a view showing the main parts of the image sensor chip according to the first embodiment;

FIGS. 13A to 13C are views showing the configuration of the solid-state image sensing apparatus according to a third embodiment;

DETAILED DESCRIPTION OF EMBODIMENTS

Hereinafter, embodiments of the present disclosure will be described with reference to the drawings.

Note that the description will be given in the following order.

Figure 1:
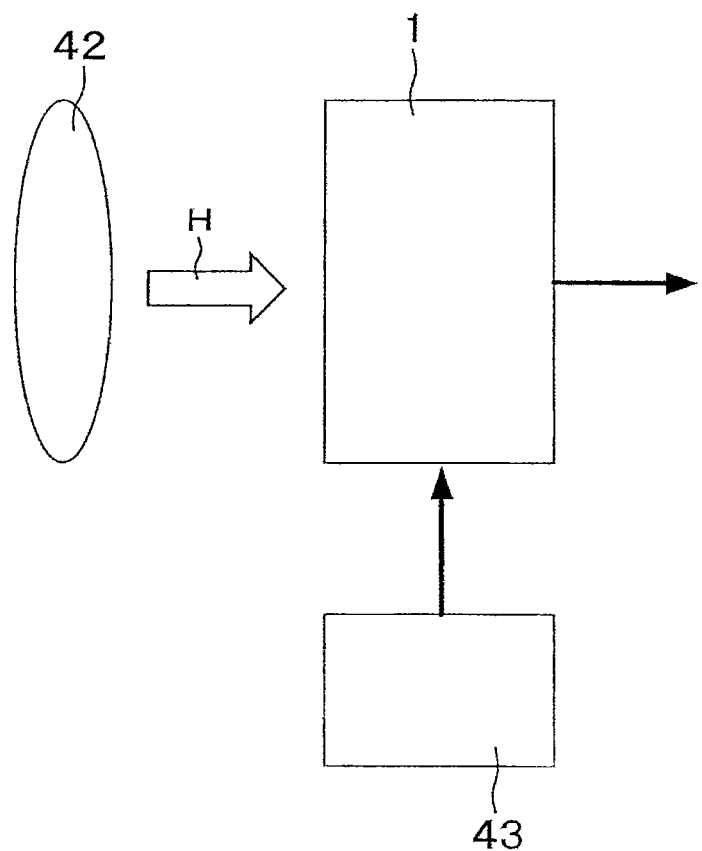
FIG. 1 is a configuration diagram showing the configuration of a camera according to a first embodiment.

(1) First Embodiment (in a case where a wiring layer provided between a sensor chip and a signal processing chip is thick)
(2) Second Embodiment (in a case where the wiring layer provided between the sensor chip and the signal processing chip has high heat conductivity)
(3) Third Embodiment (in a case where there is an air layer between the sensor chip and the signal processing chip)
(4) Fourth Embodiment (in a case where there are an intermediate plate and the air layer between the sensor chip and the signal processing chip)
(5) Fifth Embodiment (in a case where heat is transmitted to an outer lead)
(6) Sixth Embodiment (in a case where heat is transmitted to a radiation member)
(7) Other (1) First Embodiment (A) Configuration of Apparatus (A-1) Configuration of Main Parts of Camera FIG. 1 is a configuration diagram showing the configuration of a camera 40 according to a first embodiment.

As shown in FIG. 1, the camera 40 has a solid-state image sensing apparatus 1, an optical system 42, and a control unit 43. These parts will be successively described.

The solid-state image sensing apparatus 1 receives incident light H incident via the optical system 42 at its image sensing surface and photoelectrically converts the same to generate signal electric charges. Then, the solid-state image sensing apparatus 1 performs signal processing to generate and output a digital signal.

The optical system 42 includes optical members such as an imaging lens and an aperture and is arranged to condense the incident light of a subject image onto the image sensing surface of the solid-state image sensing apparatus 1.

The control unit 43 outputs various control signals to the solid-state image sensing apparatus 1 to control and drive the solid-state image sensing apparatus 1.

(A-2) Configuration of Main Parts of Solid-State Image Sensing Apparatus

The entire configuration of the solid-state image sensing apparatus 1 will be described.

FIGS. 2A to 2C are views showing the configuration of the solid-state image sensing apparatus 1 according to the first embodiment.

FIG. 2A shows the top surface of the solid-state image sensing apparatus 1. FIG. 2B shows a cross section of the solid-state image sensing apparatus 1 taken along the line X1-X2 in FIG. 2A. FIG. 2C shows a cross section of the solid-state image sensing apparatus 1 taken along the line Y1-Y2 in FIG. 2A.

As shown in FIGS. 2A to 2C, the solid-state image sensing apparatus 1 includes an image sensor chip 100, a signal processing chip 200, and a multi-layer wiring ceramic package 300.

Parts configuring the solid-state image sensing apparatus 1 will be successively described.

(a) Image Sensor Chip 100

As shown in FIGS. 2A to 2C, the image sensor chip 100 is mounted in the multi-layer wiring ceramic package 300.

As shown in FIG. 2A, the image sensor chip 100 has an image sensing area PA and a surrounding area SA in its surface.

The image sensor chip 100 receives the incident light incident as a subject image in the image sensing area PA to generate signal electric charges. A plurality of pixels (not shown) are arranged in matrix form in the image sensing area PA, and an output circuit (not shown) provided in the surrounding area SA at the periphery of the image sensing area PA outputs the signal electric charges transferred from the image sensing area PA as an output signal.

As shown in FIGS. 2B and 2C, the image sensor chip 100 is provided on the side of the top surface of the multi-layer wiring ceramic package 300.

Here, the image sensor chip 100 is accommodated inside an accommodation space SP1 recessed in the top surface of the multi-layer wiring ceramic package 300. The image sensor chip 100 is mounted by a die bonding material 710 on a surface S12 of the accommodation space SP1 serving as a die-attach surface. Further, there is a step inside the accommodation space SP1, and a wire 810 is provided between a surface S11 of the step and the front surface of the image sensor chip 100 to electrically connect the surface S11 of the step and the front surface of the image sensor chip 100 to each other.

Figure 3:
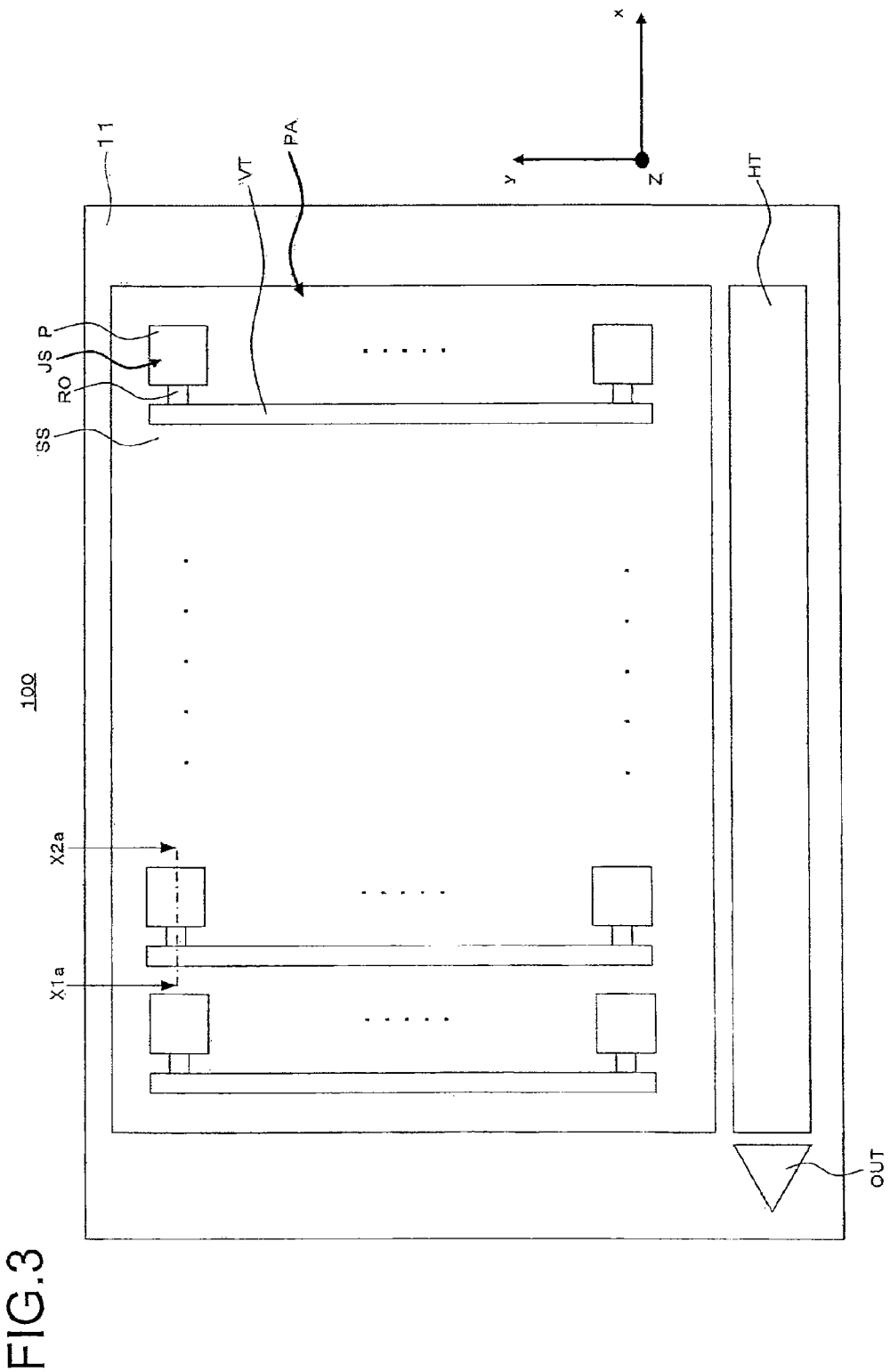
FIG. 3 is a view showing main parts of an image sensor chip according to the first embodiment.

FIGS. 3 and 4 are views showing main parts of the image sensor chip 100 according to the first embodiment. FIG. 3 schematically shows the top surface of the image sensor chip 100. FIG. 4 shows a cross section of the image sensor chip 100 taken along the line X1a-X2a in FIG. 3.

As shown in FIG. 3, the image sensor chip 100 is, for example, an inter-line type CCD solid-state image sensing device. The image sensor chip 100 has a semiconductor substrate 11, and the image sensing area PA and the surrounding area SA are provided in the surface of the semiconductor substrate 11.

As shown in FIG. 3, pixels P, electric charge reading parts RO, vertical transfer register parts VT, and device separation parts SS are provided in the image sensing area PA. On the other hand, a horizontal transfer register part HT and an output part OUT are provided in the surrounding area SA.

(a-1) Pixels P

As shown in FIG. 3, the plurality of pixels P are provided in the image sensing area PA and arranged in matrix form in a horizontal direction x and a vertical direction y.

As shown in FIG. 4, each of the pixels P has a photodiode 21. The photodiode 21 receives the incident light H at its light receiving surface JS and photoelectrically converts the same to generate signal electric charges.

More specifically, the photodiode 21 is provided inside the semiconductor substrate 11 to be positioned on the side of the front surface of the semiconductor substrate 11. Although not shown in the figures, the photodiode 21 is configured by, for example, successively forming an n-type semiconductor area (n) (not shown) and a p-type semiconductor area (p+) (not shown) on a p-type semiconductor well area (p) (not shown) formed inside the semiconductor substrate 11. The n-type semiconductor area (n) serves as a signal electric charge accumulation area. On the other hand, the p-type semiconductor area (p+) serves as a hole accumulation area and reduces the occurrence of a dark current in the n-type semiconductor area (n) serving as a signal electric charge accumulation area.

As shown in FIG. 4, a color filter CF and an on-chip lens ML are provided on a flattening film HM above the photodiode 21.

The color filter CF causes the light of a specific wavelength range among the incident light H of a subject image to be selectively transmitted to the light receiving surface JS of the semiconductor substrate 11 in a greater amount.

Figure 5:
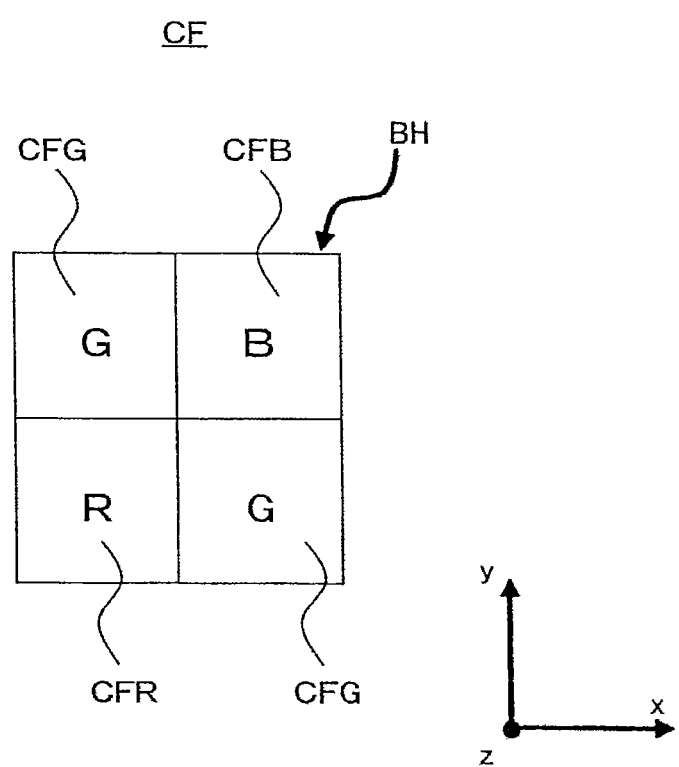
FIG. 5 is a diagram showing a color filter according to the first embodiment.

FIG. 5 is a diagram showing the color filter CF according to the first embodiment. In FIG. 5, the top surface of the color filter CF is shown.

As shown in FIG. 5, the color filter CF includes a red filter layer CFR, green filter layers CFG, and a blue filter layer CFB. The red filter layer CFR, the green filter layers CFG, and the blue filter layer CFB are adjacent to each other, and each of these filters corresponds to each of the plurality of pixels P.

Here, as shown in FIG. 5, the red filter layer CFR, the green filter layers CFG, and the blue filter layer CFB are arranged in a Bayer pattern BH. In other words, the plurality of green filter layers CFG are arranged side by side in a diagonal direction in a checkered pattern. Further, the red filter layer CFR and the blue filter layer CFB are arranged side by side in a diagonal direction in the plurality of green filter layers CFG.

As shown in FIG. 4, each of the plurality of on-chip lenses ML is arranged on the top surface of the color filter CF to correspond to each of the respective pixels P. Each of the on-chip lenses ML is a convex lens whose center is thicker than its edge at a position above the light receiving surface JS and condenses the incident light H onto the light receiving surface JS of the photodiode 21.

In each of the pixels P, the photodiode 21 receives the incident light H, which is successively incident via these parts from above, at the light receiving surface JS.

(a-2) Electric Charge Reading Parts RO, Vertical Transfer Register Parts VT, and Device Separation Parts SS As shown in FIG. 3, the plurality of electric charge reading parts RO are provided in the image sensing area PA to correspond to the plurality of pixels P and read the signal electric charges generated by the pixels P to the vertical transfer register parts VT.

As shown in FIG. 4, each of the electric charge reading parts RO has an electric charge reading channel area 22R to read the signal electric charges generated by the photodiode 21.

More specifically, as shown in FIG. 4, the electric charge reading channel area 22R is provided at a position inside the semiconductor substrate 11 and on the side of the front surface of the semiconductor substrate 11 so as to be adjacent to the photodiode 21.

Here, the electric charge reading channel area 22R is arranged on the left side of the photodiode 21 in the horizontal direction x. The electric charge reading channel area 22R is configured as, for example, a p-type semiconductor area.

As shown in FIG. 3, the vertical transfer register parts VT extend in the vertical direction y in the image sensing area PA to correspond to the plurality of pixels P arranged side by side in the vertical direction y. Further, the vertical transfer register parts VT are arranged between the columns of the plurality of pixels P arranged side by side in the vertical direction y. The plurality of vertical transfer register parts VT are provided in the image sensing area PA and arranged side by side in the horizontal direction x to correspond to the plurality of pixels P arranged side by side in the horizontal direction x. The vertical transfer register parts VT are so-called vertical transfer CCDs and successively transfer the signal electric charges read from the pixels P via the electric charge reading parts RO in the vertical direction y. For example, the vertical transfer register parts VT transfer the signal electric charges with a four-phase driving system.

As shown in FIG. 4, each of the vertical transfer register parts VT has an electric charge transfer channel area 23V. The electric charge transfer channel area 23V transfers the signal electric charges read from the photodiode 21 by the electric charge reading part RO.

More specifically, as shown in FIG. 4, the electric charge transfer channel area 23V is provided at a position inside the semiconductor substrate 11 and on the side of the front surface of the semiconductor substrate 11 so as to be adjacent to the electric charge reading channel area 22R.

Here, the electric charge transfer channel area 23V is arranged on the left side of the electric charge reading channel area 22R in the horizontal direction x. The electric charge transfer channel area 23V is configured by, for example, providing an n-type semiconductor area (n) (not shown) on a p-type semiconductor well area (p) (not shown) inside the semiconductor substrate 11.

As shown in FIG. 3, the device separation parts SS are provided at the peripheries of the plurality of pixels P to separate the pixels P from each other.

As shown in FIG. 4, each of the device separation parts SS has a channel stopper area 24S.

More specifically, as shown in FIG. 4, the channel stopper area 24S is provided at a position inside the semiconductor substrate 11 and on the side of the front surface of the semiconductor substrate 11.

Here, in the horizontal direction x, the channel stopper area 24S is provided to be interposed between the electric charge transfer channel area 23V and the photodiode 21 arranged in an adjacent column. Although a cross section of the image sensor chip 100 in the vertical direction y is not shown in the figures, the channel stopper area 24S is provided between the two photodiodes 21 arranged side by side in the vertical direction y.

The channel stopper area 24S is configured by, for example, providing a p-type semiconductor area (p+) (not shown) on a p-type semiconductor well area (p) (not shown) inside the semiconductor substrate 11 and forms a potential barrier to prevent the outflow and inflow of the signal electric charges.

As shown in FIG. 4, each of the electric charge reading parts RO, the vertical transfer register parts VT, and the device separation parts SS has a transfer electrode 31T.

Here, as shown in FIG. 4, the transfer electrode 31T is provided on the top surface of the semiconductor substrate 11 to face the electric charge reading channel area 22R and the electric charge transfer channel area 23V via a gate insulation film (not shown).

In the electric charge reading part RO, the transfer electrode 31T serves as an electric charge reading electrode that reads the signal electric charges generated by the photodiode 21. In addition, in the vertical transfer register part VT, the transfer electrode 31T serves as a vertical transfer electrode that transfers the read signal electric charges in the vertical direction y. Although not shown in the figures, the plurality of transfer electrodes 31T are arranged side by side in the vertical direction y. For example, when four-phase driving pulse signals are successively supplied to the transfer electrodes arranged side by side in the vertical direction y, the signal electric charges are transferred.

The transfer electrode 31T is formed of, for example, a conductive material such as polysilicon and provided on a gate insulation film (not shown) formed by, for example, a silicon oxide film.

On the top surface of the transfer electrode 31T, an anti-reflection film 322 is provided. The transfer electrode 31T is covered with a light shielding film 60 via an insulation film ZZ.

(a-3) Horizontal Transfer Register Part HT

As shown in FIG. 3, the horizontal transfer register part HT is arranged at the lower end of the image sensing area PA. The horizontal transfer register part HT extends in the horizontal direction x and successively transfers in the horizontal direction x the signal electric charges transferred in the vertical direction y by the plurality of vertical transfer register parts VT. That is, the horizontal transfer register part HT is a so-called horizontal transfer CCD that is driven by, for example, a two-phase driving pulse signal and transfers the signal electric charges transferred for every horizontal line (pixels of one line).

(a-4) Output Part OUT

As shown in FIG. 3, the output part OUT is provided at the left end of the horizontal transfer register part HT. The output part OUT has, for example, a source follower circuit and converts the signal electric charges horizontally transferred by the horizontal transfer register parts HT into a voltage and outputs the converted voltage as an analog signal.

(b) Signal Processing Chip 200

As shown in FIG. 2, the signal processing chip 200 is mounted in the multi-layer wiring ceramic package 300.

Here, as shown in FIGS. 2B and 2C, the signal processing chip 200 is arranged, in the multi-layer wiring ceramic package 300, on the side of the bottom surface opposite to the side of the top surface where the image sensor chip 100 is arranged. The signal processing chip 200 is arranged to face the image sensing area PA of the image sensor chip 100.

More specifically, as shown in FIGS. 2B and 2C, the signal processing chip 200 is accommodated inside a accommodation space SP2 recessed in the bottom surface of the multi-layer wiring ceramic package 300. The signal processing chip 200 is mounted by a die bonding material 720 on a bottom surface S22 of the accommodation space SP2 serving as a die-attach surface. Further, there is a step inside the accommodation space SP2, and a wire 820 is provided between a surface S21 of the step and the front surface of the signal processing chip 200 mounted on the bottom surface S22 to electrically connect the surface S21 of the step and the front surface of the signal processing chip 200 to each other.

In the signal processing chip 200, a semiconductor device (not shown) is provided in a semiconductor substrate (not shown), and the semiconductor substrate (not shown) has a multi-layer wiring layer (not shown) including a wiring (not shown) electrically connected to the semiconductor device. Further, using the semiconductor device provided in the semiconductor substrate, the signal processing chip 200 applies signal processing to an output signal output from the image sensor chip 100. The signal processing chip 200 is, for example, an analog front end (AFE) or an analog-to-digital converter (ADC), and outputs, as a digital signal, an output signal output from the image sensor chip 100 as an analog signal.

(c) Multi-Layer Wiring Ceramic Package 300

As shown in FIG. 2, the multi-layer wiring ceramic package 300 accommodates the image sensor chip 100 on its top side and the signal processing chip 200 on its bottom side opposite to the top surface where the image sensor chip 100 is provided. Further, the multi-layer wiring ceramic package 300 has a glass plate 400 on its top surface and discrete parts 500 at the periphery of the glass plate 400. Furthermore, as shown in FIG. 2A, the multi-layer wiring ceramic package 300 has the rectangular top surface and has outer leads 310 at its upper and lower ends.

Figure 6:
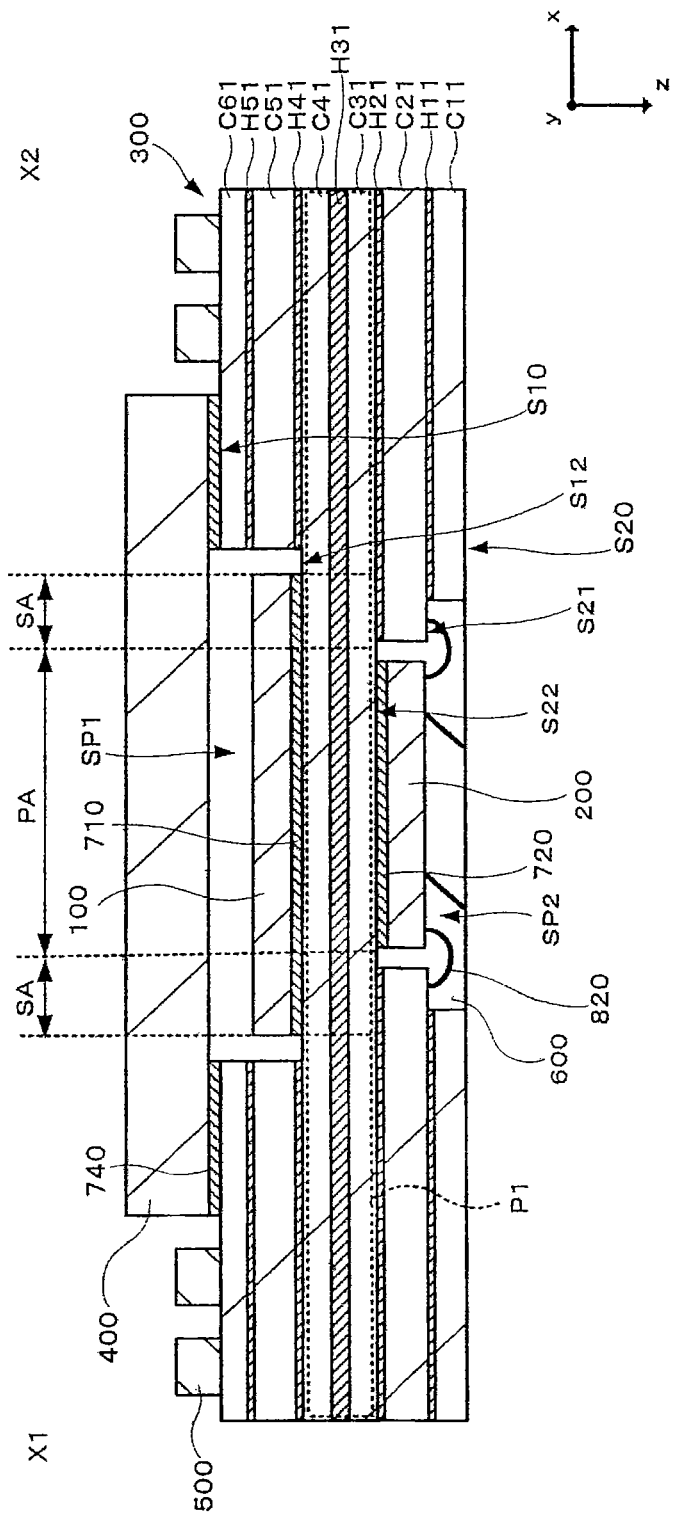
FIG. 6 is an enlarged view of a cross section of the solid-state image sensing apparatus according to the first embodiment.
Figure 7:
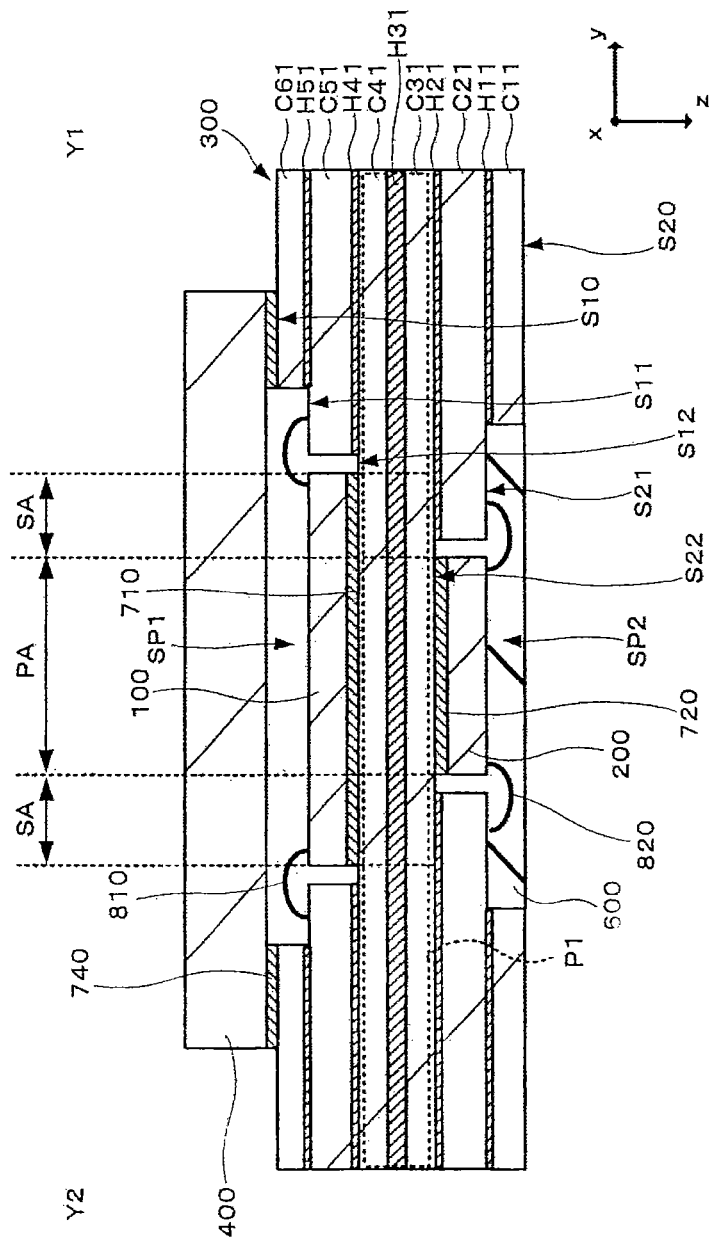
FIG. 7 is an enlarged view of a cross section of the solid-state image sensing apparatus according to the first embodiment.

FIGS. 6 and 7 are enlarged views of a cross section of the solid-state image sensing apparatus 1 according to the first embodiment.

As with FIG. 2B, FIG. 6 shows the cross section of the solid-state image sensing apparatus 1 taken along the line X1-X2 in FIG. 2A. Further, as with FIG. 2C, FIG. 7 shows the cross section of the solid-state image sensing apparatus 1 taken along the line Y1-Y2 in FIG. 2A. FIGS. 6 and 7 show the configuration of the multi-layer wiring ceramic package 300 in detail, which is omitted in FIGS. 2B and 2C.

As shown in FIGS. 6 and 7, the multi-layer wiring ceramic package 300 has a plurality of ceramic layers C11, C21, C31, C41, C51, and C61 and a plurality of wiring layers H11, H21, H31, H41, and H51. In the multi-layer wiring ceramic package 300, the ceramic layers C11 to C61 and the wiring layers H11 to H51 are alternately laminated together.

In the multi-layer wiring ceramic package 300, each of the ceramic layers C11 to C61 is formed of a ceramic material as an insulator.

In the multi-layer wiring ceramic package 300, each of the wiring layers H11 to H51 is formed of a metal conductive material such as Cu. Alternatively, each of the wiring layers H11 to H51 may be formed of a metal conductive material such as Al and W. The wiring layers H11 to H51 are electrically connected to the outer leads 310 (see FIG. 2A) if necessary. Further, the wiring layers H11 to H51 are electrically connected to the image sensor chip 100, the signal processing chip 200, and the discrete parts 500 via contact holes (not shown), which penetrate the ceramic layers C11 to C61, to electrically connect the image sensor chip 100, the signal processing chip 200, and the discrete parts 500 to each other.

As shown in FIGS. 6 and 7, the multi-layer wiring ceramic package 300 has the accommodation spaces SP1 and SP2 on the sides of the top surface and the bottom surface of its laminated body, respectively. The accommodation spaces SP1 and SP2 are formed by, for example, working the laminated body of the ceramic layers C11 to C61 and the wiring layers H11 to H51. The accommodation spaces SP1 and SP2 accommodate the image sensor chip 100 and the signal processing chip 200, respectively.

More specifically, as shown in FIGS. 6 and 7, the multi-layer wiring ceramic package 300 has the accommodation space S1 recessed in its top surface, and the image sensor chip 100 is accommodated inside the accommodation space SP1. Further, the image sensor chip 100 is mounted by the die-bonding material 710 on the surface S12 of the accommodation space SP1 serving as a die-attach surface. For example, a thermosetting adhesive (such as silver paste) is used as the die bonding material 710 to fix the image sensor chip 100.

Further, as shown in FIG. 7, there is the step inside the accommodation space SP1, and the wire 810 is provided between the surface S11 of the step and the front surface of the image sensor chip 100 to electrically connect the surface S11 of the step and the front surface of the image sensor chip 100 to each other. Using the wire 810 formed of, for example, Au, a pad electrode (not shown) provided on the surface S11 of the step and the image sensor chip 100 are electrically connected to each other.

Further, as shown in FIGS. 6 and 7, the transparent glass plate 400 is bonded by a sealing member 740 to the top surface of the multi-layer wiring ceramic package 300 to seal the accommodation space SP1.

In addition, as shown in FIG. 6, the discrete parts 500 are provided at the periphery of the glass plate 400 on the top surface of the multi-layer wiring ceramic package 300. For example, transistors, resistors, capacitors, or the like are provided as the discrete parts 500.

On the other hand, as shown in FIGS. 6 and 7, the multi-layer wiring ceramic package 300 has the accommodation space SP2 recessed in its bottom surface, and the signal processing chip 200 is accommodated inside the accommodation space SP2. Further, the signal processing chip 200 is mounted by the die-bonding material 720 on the surface S22 of the accommodation space SP2 serving as a die-attach surface. For example, a thermosetting adhesive is used as the die bonding material 720 to fix the signal processing chip 200.

Further, as shown in FIGS. 6 and 7, there is the step inside the accommodation space SP2, and the wire 820 is provided between the surface S21 of the step and the front surface of the signal processing chip 200 to electrically connect the surface S21 of the step and the front surface of signal processing chip 200 to each other. Using the wire 820 formed of, for example, Au, a pad electrode (not shown) provided on the surface S21 of the step and the signal processing chip 200 are electrically connected to each other.

Further, as shown in FIGS. 6 and 7, the multi-layer wiring ceramic package 300 has an embedding layer 600 at the bottom surface to embed the accommodation space SP2. For example, a thermosetting or ultraviolet curing resin is embedded into the accommodation space SP2 to form the embedding layer 600.

According to this embodiment, as shown in FIGS. 6 and 7, the wiring layer H31 interposed between the image sensor chip 100 and the signal processing chip 200 among the plurality of wiring layers H11 to H51 has a greater thickness than the other wiring layers H11, H21, H41, and H51. That is, in the depth direction z of the multi-layer wiring ceramic package 300, the wiring layer H31 positioned between the image sensor chip 100 and the signal processing chip 200 has a greater thickness than the other wiring layers H11, H21, H41, and H51.

More specifically, as shown in FIGS. 6 and 7, the wiring layer H31 is interposed between a pair of the accommodation spaces SP1 and SP2 and formed to have a uniform thickness to be parallel to a surface where the image sensor chip 100 and the signal processing chip 200 face each other. Further, in a part P1 positioned between the image sensor chip 100 and the signal processing chip 200, the wiring layer H31 has a greater thickness than the other wiring layers H11, H21, H41, and H51 in its range corresponding to the image sensing area PA and the surrounding area SA. Furthermore, in the part P1 positioned between the image sensor chip 100 and the signal processing chip 200, the wiring layer H31 has a greater thickness than the other wiring layers H11, H21, H41, and H51 in its range from the surrounding area SA to the outer lateral part. The wiring layer H31 is provided to have its lateral part exposed at the lateral surface of the multi-layer wiring ceramic package 300.

On the other hand, the wiring layers H11, H21, H41, and H51 other than the wiring layer H31 are provided at the lateral parts of the accommodation spaces SP1 and SP2.

For example, the wiring layers H11 to H51 are formed to have the following thickness.

The thickness of the wiring layer H31 positioned between the image sensor chip 100 and the signal processing chip 200: greater than or equal to 20 μm The thickness of the wiring layers H11, H21, H41, and H51 other than the wiring layer H31: 5 μm to 15 μm The wiring layer H31 is electrically connected to the image sensor chip 100 and the signal processing chip 200 and serves as a ground wiring. Further, in the multi-layer wiring ceramic package 300, the wiring layer H31 is provided to cover an entire part other than parts where contact holes (not shown) penetrating the wiring layer H31 are provided in a surface (xy surface) parallel to the surface where the image sensor chip 100 and the signal processing chip 200 face each other.

(B) Operations

Figure 8:
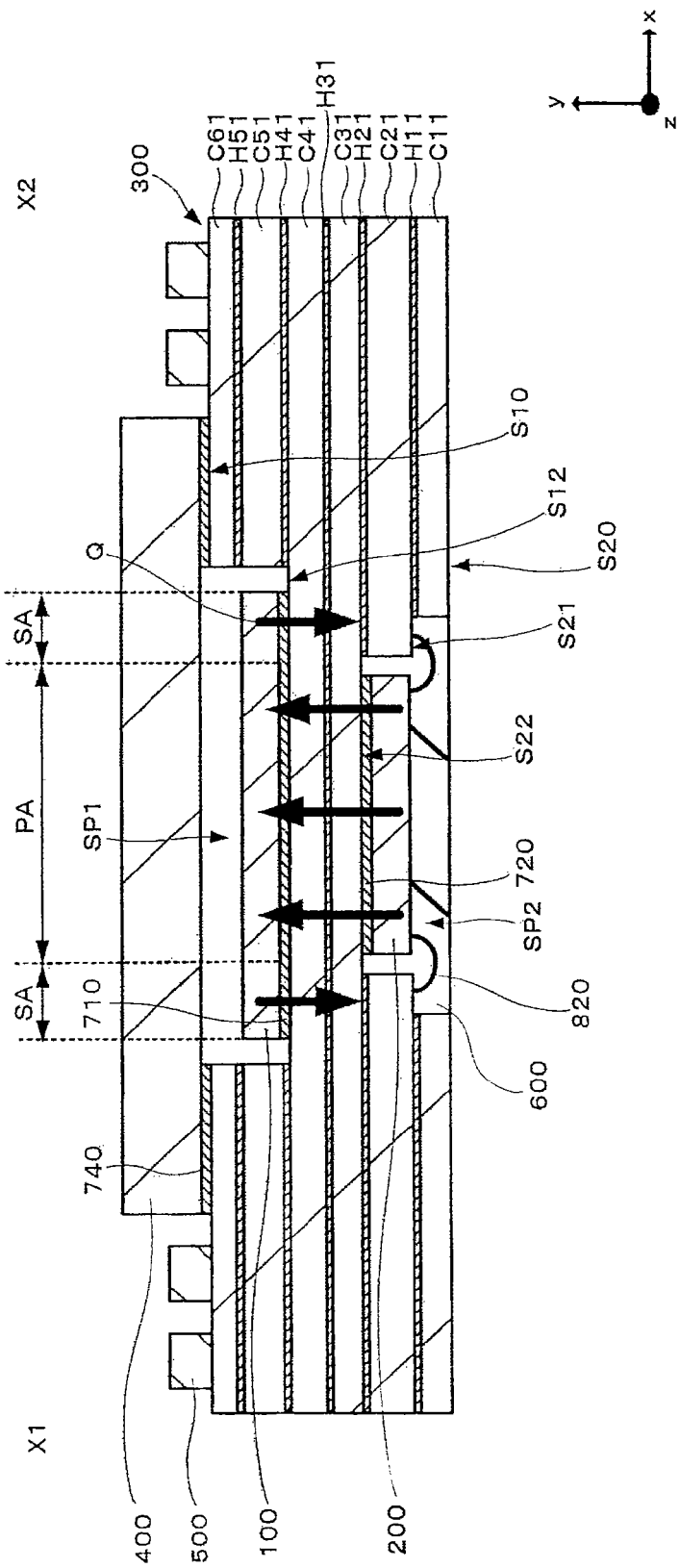
FIG. 8 is an enlarged view schematically showing heat transmission in the solid-state image sensing apparatus according to the first embodiment.
Figure 9:
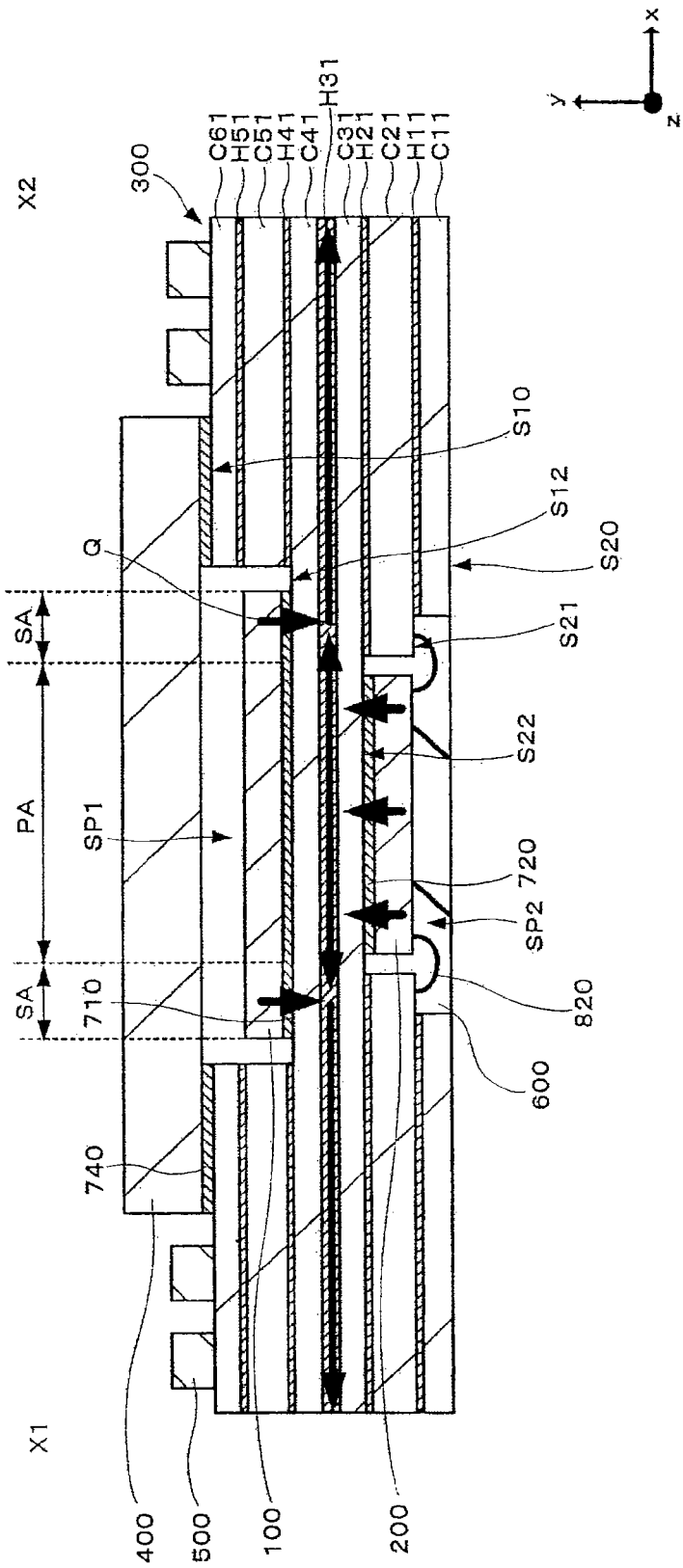
FIG. 9 is an enlarged view schematically showing heat transmission in the solid-state image sensing apparatus according to the first embodiment.

FIGS. 8 and 9 are enlarged views schematically showing heat transmission in the solid-state image sensing apparatus 1 according to the first embodiment.

Unlike the case of this embodiment, FIG. 8 shows a case where the wiring layer H31 positioned between the image sensor chip 100 and the signal processing chip 200 has the same thickness as the other wiring layers H11, H21, H41, and H51.

On the other hand, FIG. 9 shows the case of this embodiment where the wiring layer H31 positioned between the image sensor chip 100 and the signal processing chip 200 has a greater thickness than the other wiring layers H11, H21, H41, and H51.

In the image sensor chip 100, power is hardly consumed in the image sensing area PA and mostly consumed in the surrounding area SA where a peripheral circuit such as an output circuit having, for example, a source follower circuit is provided. Further, the signal processing chip 200 consumes much power than the image sensor chip 100.

Therefore, as shown in FIG. 8, heat Q generated from the signal processing chip 200 is transmitted to the image sensing area PA of the image sensor chip 100, which may increase the temperature of the image sensing area PA of the image sensor chip 100 and significantly degrade dark current characteristics. For example, with a temperature increase of several to ten degrees, the occurrence of a dark current may be increased by about 1.5 to three times. As a result, image quality of a captured image may be reduced.

On the other hand, according to this embodiment, the thick wiring layer H31 is provided, as shown in FIG. 9, at the part where the image sensing area PA of the image sensor chip 100 and the signal processing chip 200 face each other. Further, the thick wiring layer H31 is also provided in the range from the surrounding area SA to the outer lateral part. The wiring layer H31 has the lateral part exposed at the lateral surface of the multi-layer wiring ceramic package 300.

The wiring layer H31 has higher heat conductivity than the ceramic layers C11 to C61 configuring the multi-layer wiring ceramic package 300. Therefore, heat Q from the signal processing chip 200 to the image sensing area PA of the image sensor chip 100 is transmitted to the wiring layer H31 and radiated to an outside. Besides, heat Q generated at the surrounding area SA of the image sensor chip 100 is also transmitted to the wiring layer H31 and radiated to the outside.

As shown in FIG. 9, because the wiring layer H31 according to this embodiment has a greater thickness than the wiring layer 31H according to the case shown in FIG. 8, the heat Q may be radiated to the outside in a greater amount.

Thus, according to this embodiment, it is possible to reduce an increase in the temperature of the image sensing area PA of the image sensor chip 100.

(C) Summary

As described above, according to this embodiment, the image sensor chip 100 has the pixels P that receive the incident light to generate signal electric charges in the image sensing area PA. The signal processing chip 200 is arranged to face the image sensing area PA of the image sensor chip 100 and applies signal processing to a signal output from the image sensor chip 100. The multi-layer wiring ceramic package 300 has the plurality of wiring layers H11 to H51 laminated together via the ceramic layers C11 to C61 serving as insulators and has the image sensor chip 100 and the signal processing chip 200 (see FIG. 6 and the like).

Here, among the plurality of wiring layers H11 to H51, the wiring layer H31 provided between the image sensor chip 100 and the signal processing chip 200 has a greater thickness than the other wiring layers H11, H21, H41, and H51.

Therefore, according to this embodiment, the heat Q from the signal processing chip 200 to the image sensing area PA of the image sensor chip 100 is likely to be transmitted to the wiring layer H31 and radiated to the outside as described above. Besides, the heat Q generated at the surrounding area SA of the image sensor chip 100 is also likely to be transmitted to the wiring layer H31 and radiated to the outside (see FIG. 9 and the like).

Thus, according to this embodiment, it is possible to reduce an increase in the temperature of the image sensing area PA and the occurrence of a dark current in the image sensor chip 100. Therefore, image quality of a captured image may be improved.

Further, according to this embodiment, only the wiring layer H31 positioned between the image sensor chip 100 and the signal processing chip 200 has a greater thickness in the depth direction z of the multi-layer wiring ceramic package 300. Therefore, because the entire multi-layer wiring ceramic package 300 is not significantly thick, the small-sized solid-state image sensing apparatus 1 may be achieved.

Furthermore, according to this embodiment, the wiring layer H31 positioned between the image sensor chip 100 and the signal processing chip 200 serves as a ground wiring. Therefore, even if parasitic capacitance increases, the impact of the parasitic capacitance is small because it is the ground wiring. Moreover, because the ground wiring is allowed to be formed in a large area in the multi-layer wiring ceramic package 300, the heat may be effectively radiated.

Note that according to this embodiment, the wiring layer H31 has the same heat conductivity as the other wiring layers H11, H21, H41, and H51, but the heat conductivity of the wiring layers is not limited to this. More favorably, the wiring layer H31 has higher heat conductivity than the other wiring layers H11, H21, H41, and H51 because the heat may be transmitted and radiated to the outside in a greater amount.

(2) Second Embodiment (A) Configuration of Apparatus

Figure 10:
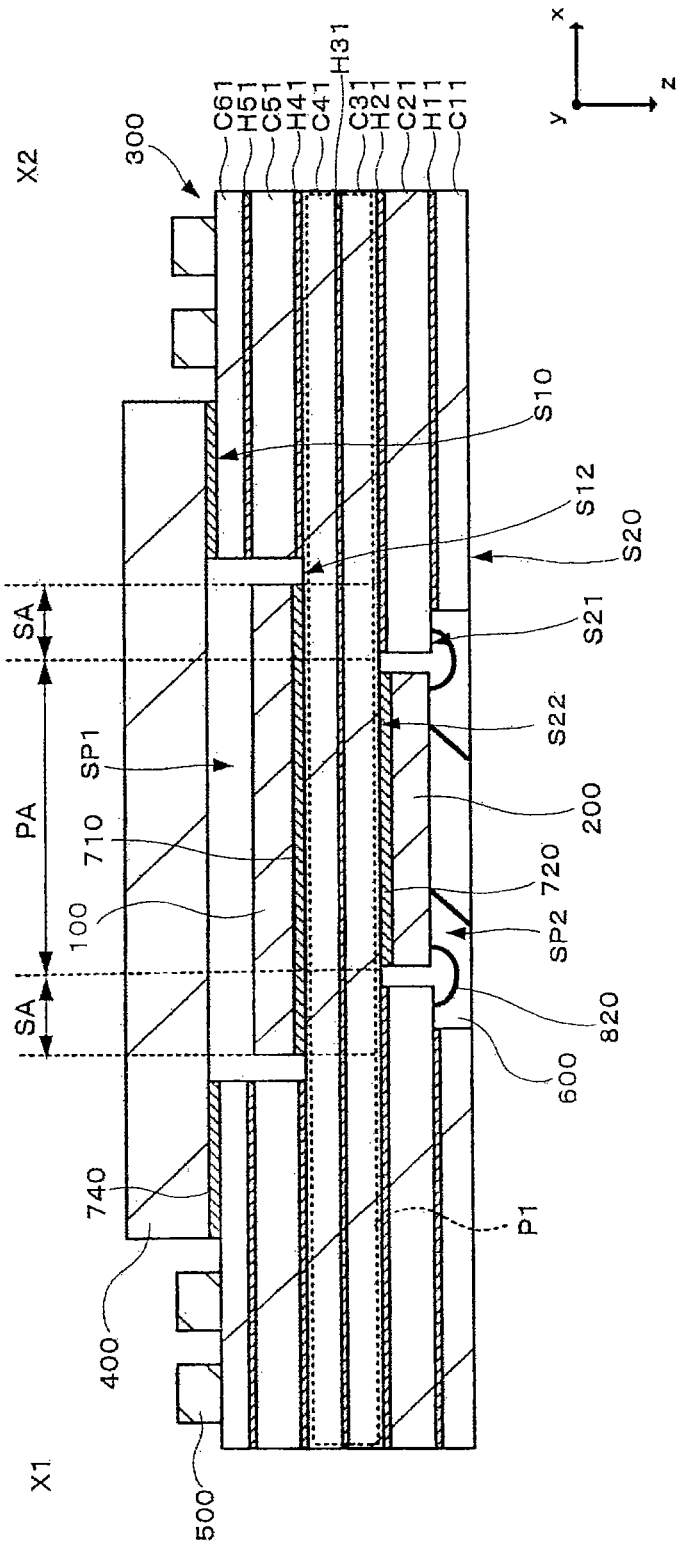
FIG. 10 is an enlarged view of a cross section of the solid-state image sensing apparatus according to a second embodiment.
Figure 11:
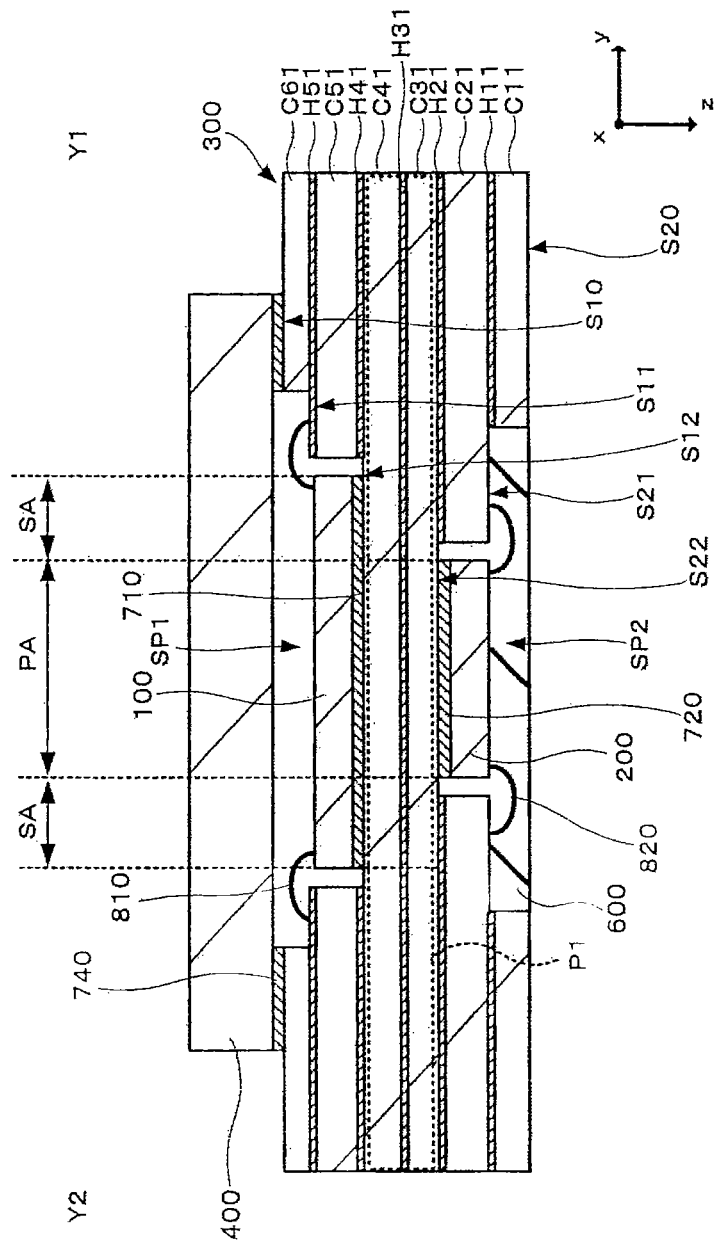
FIG. 11 is an enlarged view of a cross section of the solid-state image sensing apparatus according to the second embodiment.

FIGS. 10 and 11 are enlarged views of a cross section of the solid-state image sensing apparatus according to a second embodiment.

As with FIGS. 2B and 6, FIG. 10 shows the cross section of the solid-state image sensing apparatus taken along the line X1-X2 in FIG. 2A. Further, as with FIGS. 2C and 7, FIG. 11 shows the cross section of the solid-state image sensing apparatus taken along the line Y1-Y2 in FIG. 2A. FIGS. 10 and 11 show the configuration of the multi-layer wiring ceramic package 300 in detail, which is omitted in FIGS. 2B and 2C.

As shown in FIGS. 10 and 11, this embodiment is different from the first embodiment in the wiring layer H31 positioned between the image sensor chip 100 and the signal processing chip 200 in the depth direction z of the multi-layer wiring ceramic package 300. Except for this point and relevant points, this embodiment is the same as the first embodiment. Therefore, descriptions of the duplicated parts will be omitted.

According to this embodiment, as shown in FIGS. 10 and 11, the wiring layer H31 interposed between the image sensor chip 100 and the signal processing chip 200 among the plurality of wiring layers H11 to H51 has the same thickness as the other wiring layers H11, H21, H41, and H51. That is, in the depth direction z of the multi-layer wiring ceramic package 300, the wiring layer H31 positioned between the image sensor chip 100 and the signal processing chip 200 has the same thickness as the other wiring layers H11, H21, H41, and H51.

According to the first embodiment, the wiring layer H31 is formed of the material same as that of the other wiring layers H11, H21, H41, and H51. However, according to this embodiment, the wiring layer H31 is formed of a material different from that of the other wiring layers H11, H21, H41, and H51.

Here, the wiring layer H31 positioned between the image sensor chip 100 and the signal processing chip 200 is formed of the material having higher heat conductivity than the other wiring layers H11, H21, H41, and H51.

The wiring layer H31 positioned between the image sensor chip 100 and the signal processing chip 200 is formed of, for example, Cu. On the other hand, the wiring layers H11, H21, H41, and H51 other than the wiring layer H31 positioned between the image sensor chip 100 and the signal processing chip 200 are formed of, for example, W.

(B) Operations

Figure 12:
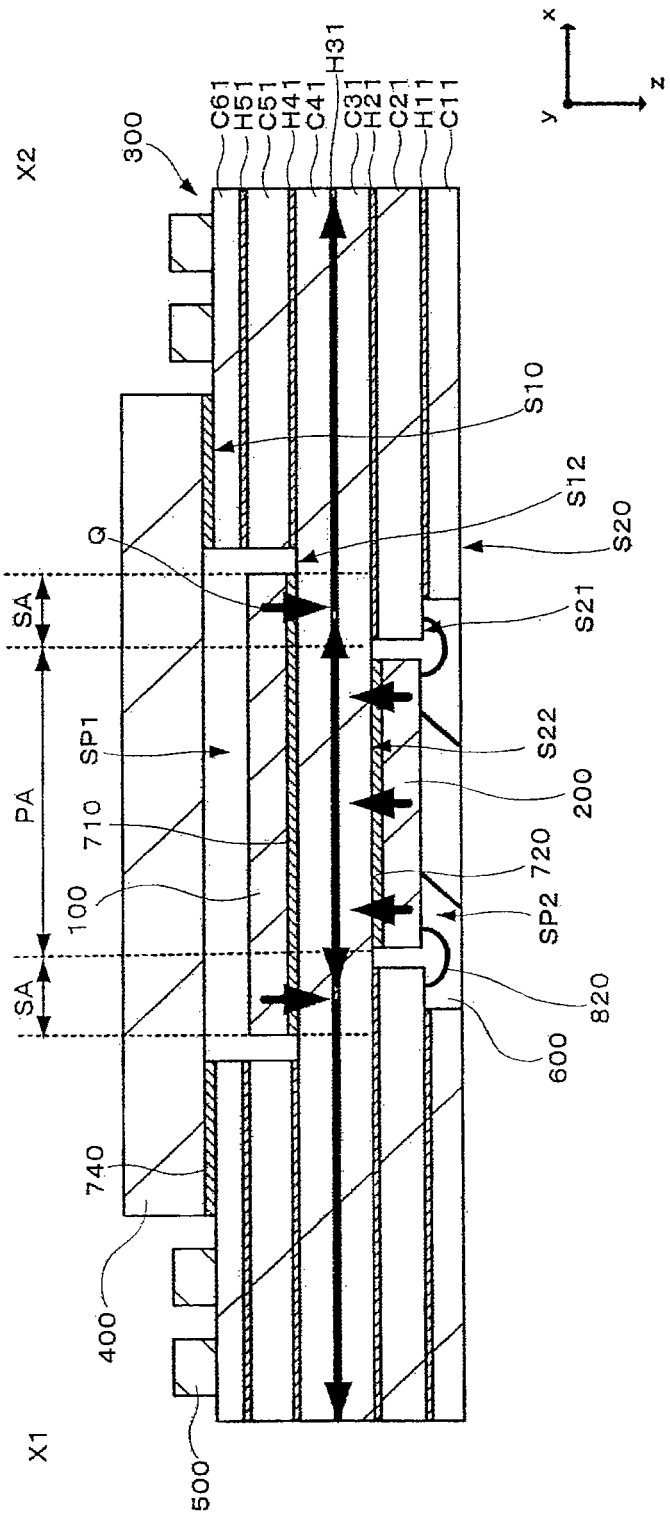
FIG. 12 is an enlarged view schematically showing heat transmission in the solid-state image sensing apparatus according to the second embodiment.

FIG. 12 is an enlarged view schematically showing heat transmission in the solid-state image sensing apparatus according to the second embodiment.

As described above, the transmission of the heat Q from the signal processing chip 200 to the image sensing area PA of the image sensor chip 100 may result in an increase in the temperature of the image sensing area PA of the image sensor chip 100 and significant degradation in dark current characteristics.

However, according to this embodiment, the wiring layer H31 is provided, as shown in FIG. 12, at the part where the image sensing area PA of the image sensor chip 100 and the signal processing chip 200 face each other. The wiring layer H31 is formed of the material having higher heat conductivity than the other wiring layers H11, H21, H41, and H51.

Therefore, the heat Q from the signal processing chip 200 to the image sensing area PA of the image sensor chip 100 is transmitted to the wiring layer H31 and radiated to the outside. Besides, the heat Q generated at the surrounding area SA of the image sensor chip 100 is also transmitted to the wiring layer H31 and radiated to the outside.

Because the wiring layer H31 according to this embodiment has higher heat conductivity than the wiring layer 31H according to the case shown in FIG. 8, the heat Q may be radiated to the outside in a greater amount.

Thus, according to this embodiment, it is possible to reduce an increase in the temperature of the image sensing area PA of the image sensor chip 100.

(C) Summary

As described above, according to this embodiment, the wiring layer H31 provided between the image sensor chip 100 and the signal processing chip 200 among the plurality of wiring layers H11 to H51 has the same thickness as the other wiring layers H11, H21, H41, and H51. Further, the wiring layer H31 is formed to have higher heat conductivity than the other wiring layers H11, H21, H41, and H51.

Therefore, according to this embodiment, the heat Q from the signal processing chip 200 to the image sensing area PA of the image sensor chip 100 is likely to be transmitted to the wiring layer H31 having higher heat conductivity and radiated to the outside as described above. Besides, the heat Q generated at the surrounding area SA of the image sensor chip 100 is also likely to be transmitted to the wiring layer H31 and radiated to the outside.

Thus, according to this embodiment, it is possible to reduce an increase in the temperature of the image sensing area PA and the occurrence of a dark current in the image sensor chip 100. Therefore, image quality of a captured image may be improved.

Note that according to this embodiment, the wiring layer H31 positioned between the image sensor chip 100 and the signal processing chip 200 has the same thickness as the other wiring layers H11, H21, H41, and H51, but the thickness of the wiring layers is not limited to this. More favorably, the wiring layer H31 has a greater thickness than the other wiring layers H11, H21, H41, and H51 because the heat may be transmitted and radiated to the outside in a greater amount.

(3) Third Embodiment (A) Configuration of Apparatus

FIGS. 13A to 13C are views showing the configuration of the solid-state image sensing apparatus according to a third embodiment.

As with FIGS. 2A to 2C, FIGS. 13A to 13C schematically show the configuration of the solid-state image sensing apparatus. FIG. 13A shows the top surface of the solid-state image sensing apparatus. FIG. 13B shows a cross section of the solid-state image sensing apparatus taken along the line X1-X2 in FIG. 13A. FIG. 13C shows a cross section of the solid-state image sensing apparatus taken along the line Y1-Y2 in FIG. 13A.

As shown in FIGS. 13A to 13C, this embodiment is different from the first embodiment in a surface where the signal processing chip 200 is provided in the multi-layer wiring ceramic package 300. Except for this point and relevant points, this embodiment is the same as the first embodiment. Therefore, descriptions of the duplicated parts will be omitted.

As shown in FIGS. 13A to 13C, both the image sensor chip 100 and the signal processing chip 200 are mounted, as in the case of the first embodiment, in the multi-layer wiring ceramic package 300.

Here, as shown in FIGS. 13B and 13C, the multi-layer wiring ceramic package 300 has, unlike the case of the first embodiment, the accommodation space SP1 on the side of its top surface only. Both the image sensor chip 100 and the signal processing chip 200 are provided inside the accommodation space SP1.

Figure 14:
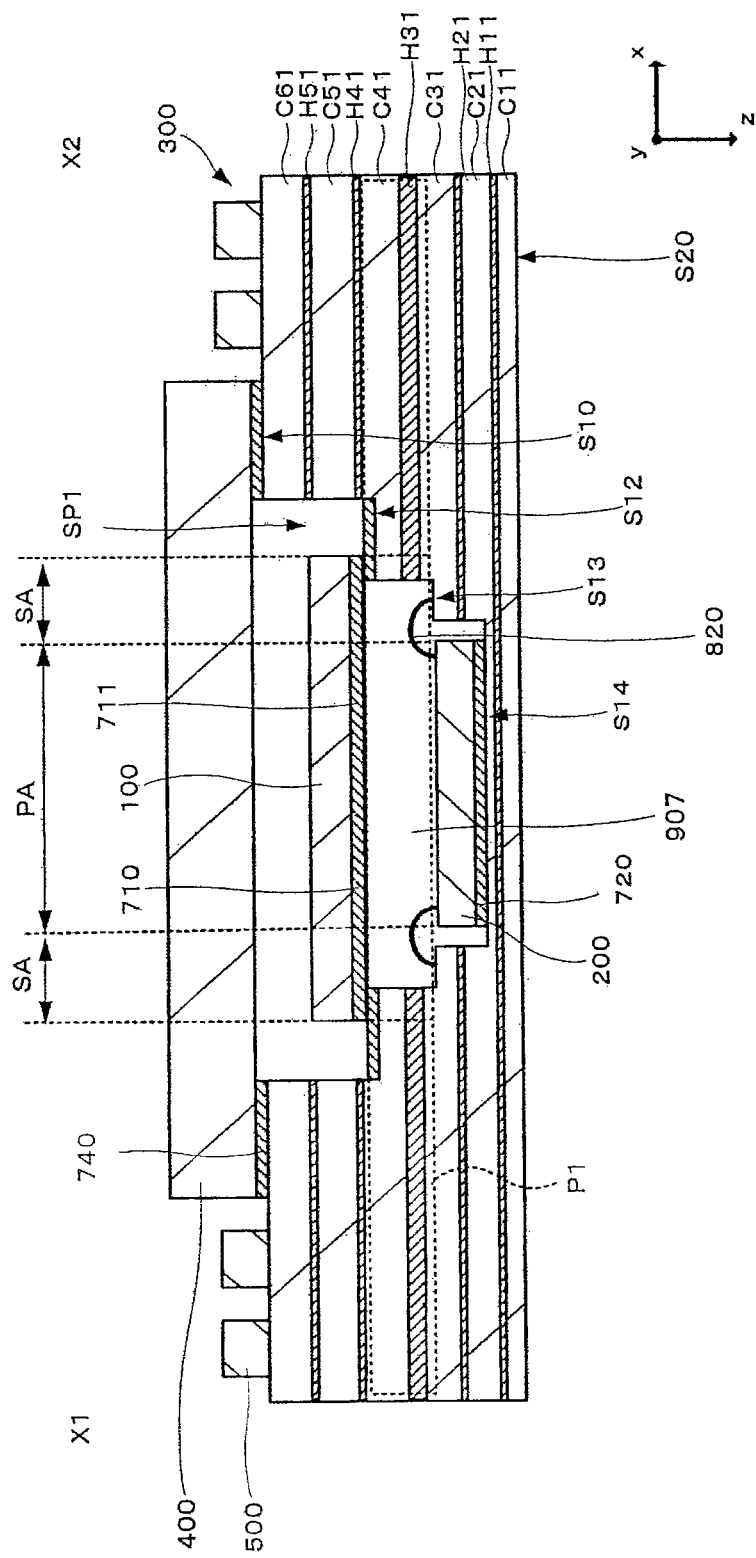
FIG. 14 is an enlarged view of a cross section of the solid-state image sensing apparatus according to the third embodiment.
Figure 15:
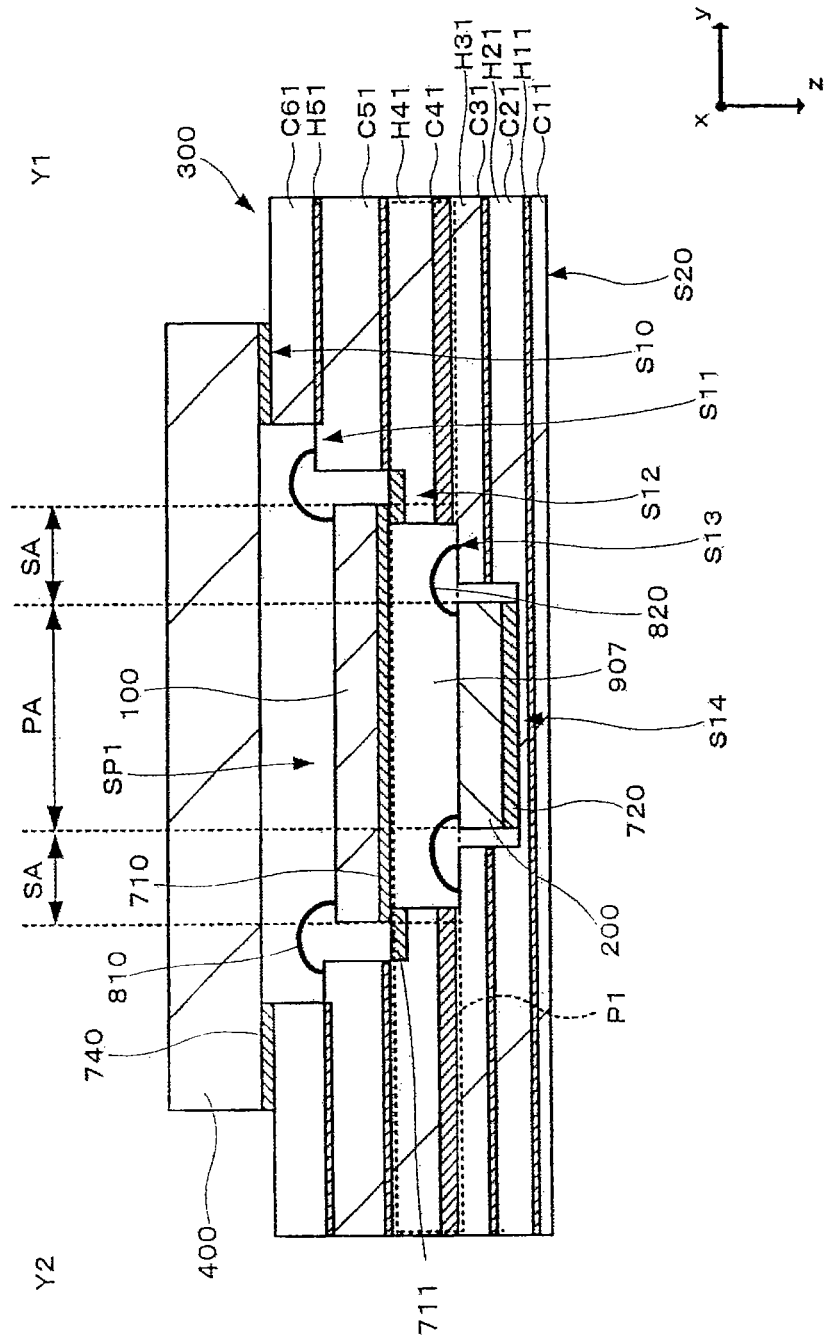
FIG. 15 is an enlarged view of a cross section of the solid-state image sensing apparatus according to the third embodiment.

FIGS. 14 and 15 are enlarged views of the cross section of the solid-state image sensing apparatus according to the third embodiment.

As with FIG. 13B, FIG. 14 shows the cross section of the solid-state image sensing apparatus taken along the line X1-X2 in FIG. 13A. Further, as with FIG. 13C, FIG. 15 shows the cross section of the solid-state image sensing apparatus taken along the line Y1-Y2 in FIG. 13A. FIGS. 14 and 15 show the configuration of the multi-layer wiring ceramic package 300 in detail, which is omitted in FIGS. 13B and 13C.

As shown in FIGS. 14 and 15, the multi-layer wiring ceramic package 300 has the recessed accommodation space SP1 on the side of its top surface.

Here, the accommodation space SP1 of the multi-layer wiring ceramic package 300 is structured to expand upward in a stepped state from its bottom surface. According to this embodiment, both the image sensor chip 100 and the signal processing chip 200 are accommodated inside the accommodation space SP1 to overlap with each other via a low heat conduction layer 907. Further, the image sensor chip 100 and the signal processing chip 200 are electrically connected to each other via the multi-layer wiring ceramic package 300.

More specifically, as shown in FIG. 14 and the like, the signal processing chip 200 is mounted by the die-bonding material 720 on the bottommost surface S14 of the accommodation space SP1 serving as a die-attach surface. For example, a thermosetting adhesive (such as silver paste) is used as the die bonding material 720 to fix the signal processing chip 200. That is, the signal processing chip 200 is mounted on the zero-th step of the accommodation space SP1.

Further, as shown in FIG. 14 and the like, there are a plurality of steps inside the accommodation space SP1, and the wire 820 is provided between a top surface S13 of one of the steps and the front surface of the signal processing chip 200 to electrically connect the top surface S13 of the step and the front surface of the signal processing chip 200 to each other. Using the wire 820 formed of, for example, Au, a pad electrode (not shown) provided on the top surface S13 of the step and the signal processing chip 200 are electrically connected to each other. That is, on the first step of the accommodation space SP1, the pad electrode (not shown) and the signal processing chip 200 are electrically connected to each other.

Further, as shown in FIG. 14 and the like, inside the accommodation space SP1, the image sensor chip 100 is mounted by the die-bonding material 710 on a top surface S12 serving as a die-attach surface of the step higher in level than the step where the wire 820 is provided. For example, a thermosetting adhesive (such as silver paste) is used as the die bonding material 710 to fix the image sensor chip 100. That is, the image sensor chip 100 is mounted on the second step of the accommodation space SP1. In the surrounding area SA, the image sensor chip 100 is bonded to the second step of the accommodation space SP1. The image sensor chip 100 is bonded to the multi-layer wiring ceramic package 300 in the surrounding area SA positioned at the periphery of the image sensing area PA.

Further, as shown in FIG. 15, the wire 810 is provided between the top surface S11 of the step higher in level than the step serving as the die-attach surface and the front surface of the image sensor chip 100 to electrically connect the top surface S11 of the step and the front surface of the image sensor chip 100 to each other. Using the wire 810 formed of, for example Au, a pad electrode (not shown) provided on the top surface S11 of the step and the image sensor chip 100 are electrically connected to each other. That is, on the third step of the accommodation space SP1, the pad electrode (not shown) and the image sensor chip 100 are electrically connected to each other.

Further, as shown in FIG. 14 and the like, the transparent glass plate 400 is bonded by the sealing member 740 to the top surface of the multi-layer wiring ceramic package 300 to seal the accommodation space SP1.

Further, as shown in FIG. 14 and the like, the low heat conduction layer 907 is interposed between the image sensor chip 100 and the signal processing chip 200. In the image sensing area PA of the image sensor chip 100, the low heat conduction layer 907 is provided on the side of the bottom surface opposite to the top surface where the incident light is incident.

The low heat conduction layer 907 has lower heat conductivity than the ceramic layers C11 to C61 configuring the multi-layer wiring ceramic package 300 and insulates the heat transmitted from the heated signal processing chip 200 to the image sensing area PA of the image sensor chip 100.

Here, inside the accommodation space SP1, a part between the entire surface of the image sensing area PA of the image sensor chip 100 and the entire top surface of the signal processing chip 200 is provided as the low heat conduction layer 907.

As shown in FIG. 14 and the like, the low heat conduction layer 907 is, for example, an air layer. Note that the low heat conduction layer 907 is not limited to the air layer but may be formed of an organic material such as an epoxy resin.

Further, as shown in FIG. 14 and the like, the wiring layer H31 positioned between the image sensor chip 100 and the signal processing chip 200 has a greater thickness than the other wiring layers H11, H21, H41, and H51 in the depth direction z of the multi-layer wiring ceramic package 300.

More specifically, in the part P1 positioned between the image sensor chip 100 and the signal processing chip 200, the wiring layer H31 has a greater thickness than the other wiring layers H11, H21, H41, and H51 in its range corresponding to the surrounding area SA. Furthermore, in the part P1 positioned between the image sensor chip 100 and the signal processing chip 200, the wiring layer H31 has a greater thickness than the other wiring layers H11, H21, H41, and H51 in its range from the surrounding area SA to an outer lateral part. The wiring layer H31 is provided to have the lateral part exposed at the lateral surface of the multi-layer wiring ceramic package 300.

The wiring layer H31 is electrically connected to the image sensor chip 100 and the signal processing chip 200 and serves as a ground wiring. Further, in the multi-layer wiring ceramic package 300, the wiring layer H31 is provided to cover the entire part other than the parts where the contact holes (not shown) penetrating the wiring layer H31 are provided in the surface (xy surface) parallel to the surface where the image sensor chip 100 and the signal processing chip 200 face each other.

(B) Operations

Figure 16:
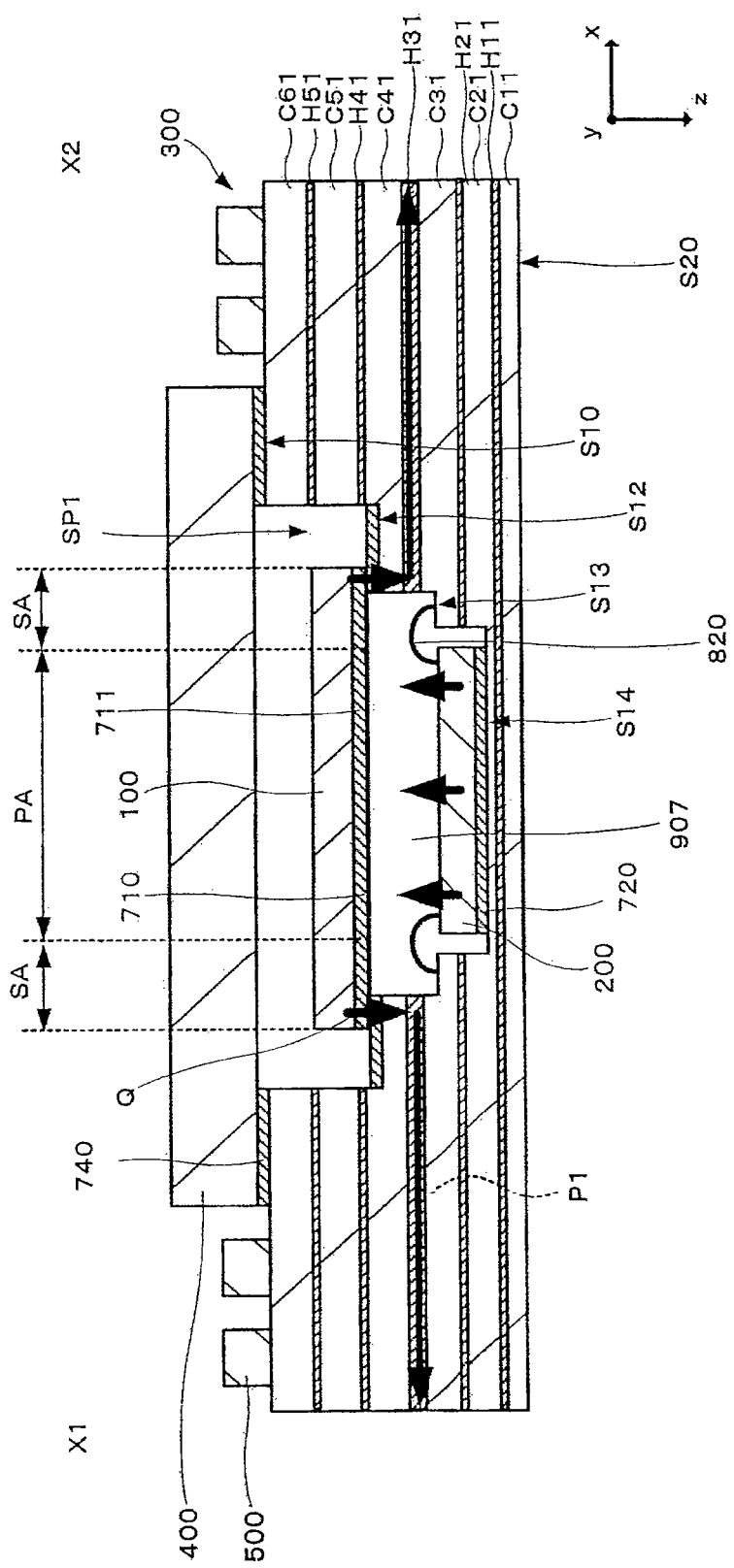
FIG. 16 is an enlarged view schematically showing heat transmission in the solid-state image sensing apparatus according to the third embodiment.

FIG. 16 is an enlarged view schematically showing heat transmission in the solid-state image sensing apparatus according to the third embodiment.

As described above, the transmission of the heat Q from the signal processing chip 200 to the image sensing area PA of the image sensor chip 100 may result in an increase in the temperature of the image sensing area PA of the image sensor chip 100 and significant degradation in dark current characteristics.

However, according to this embodiment, the low heat conduction layer 907 is provided, as shown in FIG. 16, at the part where the image sensing area PA of the image sensor chip 100 and the signal processing chip 200 face each other.

Because the low heat conduction layer 907 has lower heat conductivity than the ceramic layers C11 to C61 configuring the multi-layer wiring ceramic package 300, the heat Q from the signal processing chip 200 to the image sensing area PA of the image sensor chip 100 is insulated by the low heat conduction layer 907.

Further, the surrounding area SA of the image sensor chip 100 is bonded to the surface S12 of the multi-layer wiring ceramic package 300. Therefore, the heat Q of the surrounding area SA is transmitted to the wiring layer H31 and radiated to the outside.

Because the wiring layer H31 according to this embodiment has a greater thickness than the other wiring layers H11, H21, H41, and H51 as in the case of the first embodiment, the heat Q may be radiated to the outside in a greater amount.

Thus, according to this embodiment, it is possible to reduce an increase in the temperature of the image sensing area PA of the image sensor chip 100.

(C) Summary

As described above, according to this embodiment, the multi-layer wiring ceramic package 300 has the accommodation space SP1 at the one surface. Further, the image sensor chip 100 and the signal processing chip 200 are provided inside the accommodation space SP1 to overlap with each other via the low heat conduction layer 907 (air layer). Furthermore, the wiring layer H31 having a greater thickness than the other wiring layers H11, H21, H41, and H51 is provided at the lateral part of the low heat conduction layer 907 (air layer).

As described above, according to this embodiment, the low heat conduction layer 907 (air layer) is provided to be interposed at the part where the image sensing area PA of the image sensor chip 100 and the signal processing chip 200 face each other. Therefore, the heat from the heated signal processing chip 200 to the image sensing area PA of the image sensor chip 100 is insulated by the low heat conduction layer 907 (air layer).

Besides, the heat of the surrounding area SA of the image sensor chip 100 may be radiated via the thick wiring layer H31.

Thus, according to this embodiment, it is possible to reduce an increase in the temperature of the image sensing area PA and the occurrence of a dark current in the image sensor chip 100. Therefore, image quality of a captured image may be improved.

(4) Fourth Embodiment

(A) Configuration of Apparatus

Figure 17:
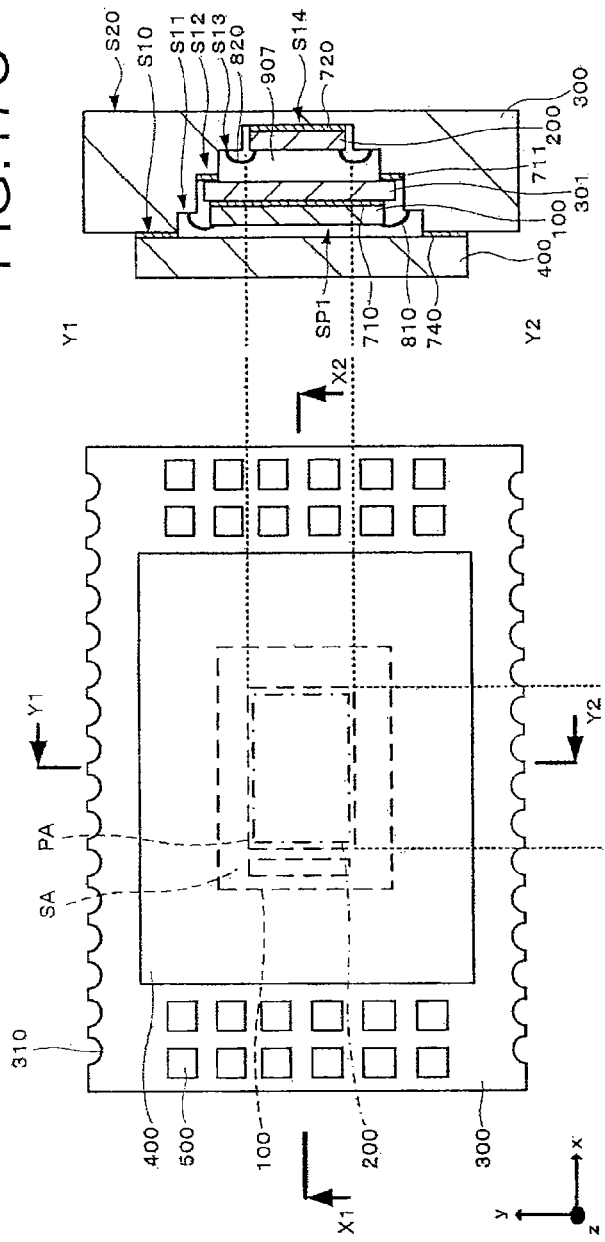
FIGS. 17A to 17C are views showing the configuration of the solid-state image sensing apparatus according to a fourth embodiment.

FIGS. 17A to 17C are views showing the configuration of the solid-state image sensing apparatus according to a fourth embodiment.

As with FIGS. 13A to 13C, FIGS. 17A to 17C schematically show the configuration of the solid-state image sensing apparatus. FIG. 17A shows the top surface of the solid-state image sensing apparatus. FIG. 17B shows a cross section of the solid-state image sensing apparatus taken along the line X1-X2 in FIG. 17A. FIG. 17C shows a cross section of the solid-state image sensing apparatus taken along the line Y1-Y2 in FIG. 17A.

As shown in FIGS. 17A to 17C, this embodiment is different from the third embodiment in an intermediate plate 301. Except for this point and relevant points, this embodiment is the same as the third embodiment. Therefore, descriptions of the duplicated parts will be omitted.

As shown in FIGS. 17B and 17C, the intermediate plate 310 is provided between the image sensor chip 100 and the signal processing chip 200. Here, the multi-layer wiring ceramic package 300 has a trench at its top surface as the accommodation space SP1, and the intermediate plate 301 is accommodated inside the accommodation space SP1.

Figure 18:
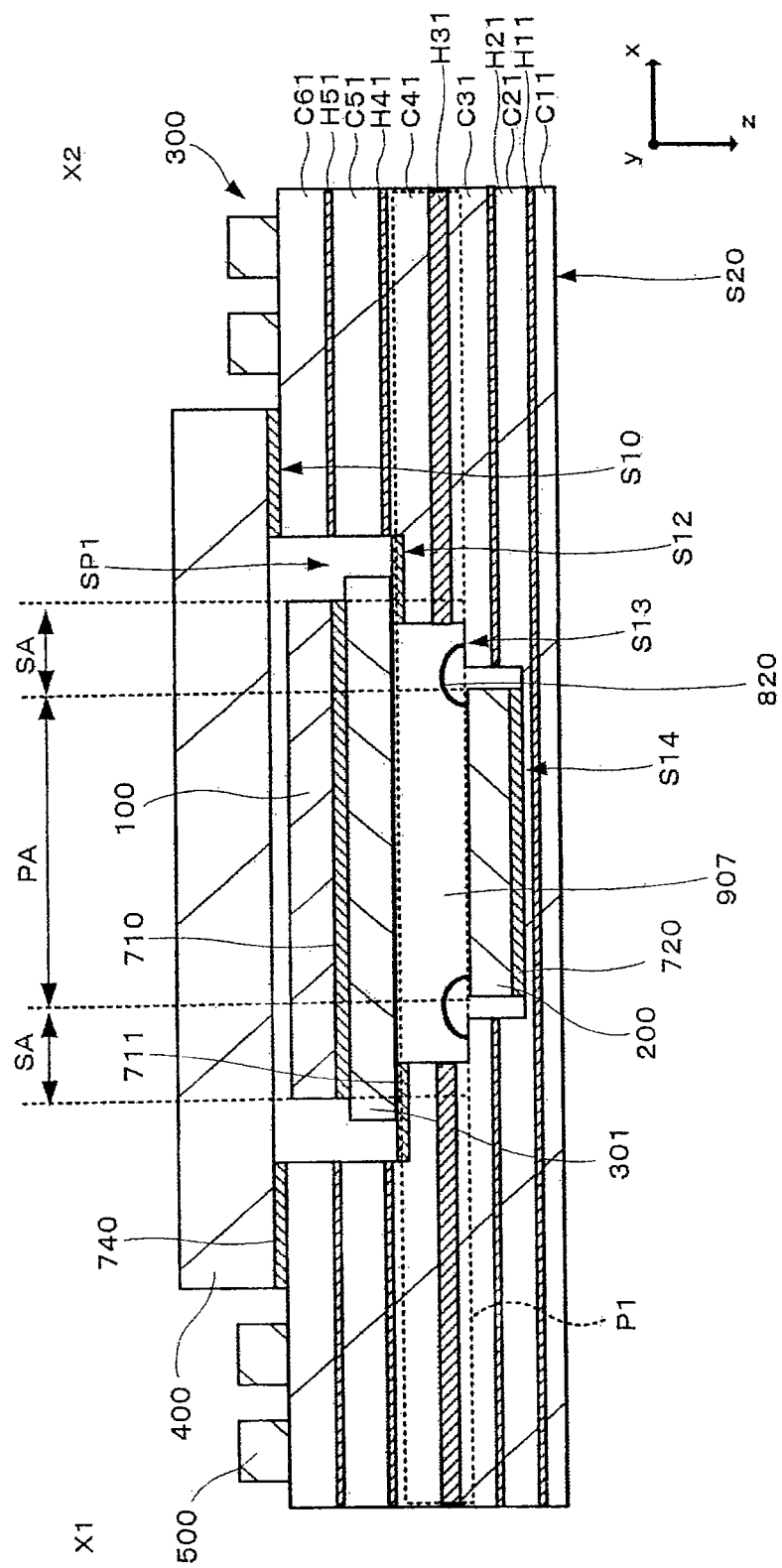
FIG. 18 is an enlarged view of a cross section of the solid-state image sensing apparatus according to the fourth embodiment.
Figure 19:
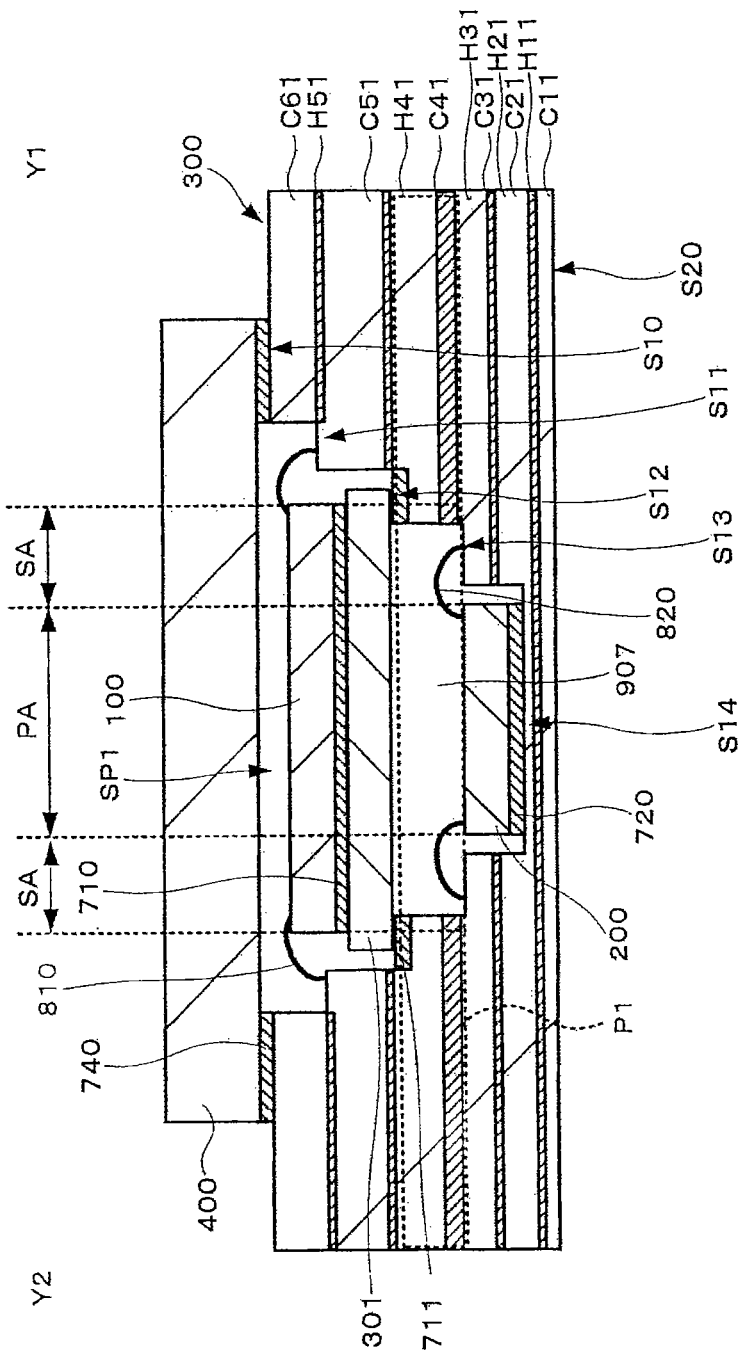
FIG. 19 is an enlarged view of a cross section of the solid-state image sensing apparatus according to the fourth embodiment.

FIGS. 18 and 19 are enlarged views of the cross section of the solid-state image sensing apparatus according to the fourth embodiment.

As with FIG. 17B, FIG. 18 shows the cross section of the solid-state image sensing apparatus taken along the line X1-X2 in FIG. 17A. Further, as with FIG. 17C, FIG. 19 shows the cross section of the solid-state image sensing apparatus taken along the line Y1-Y2 in FIG. 17A. FIGS. 18 and 19 show the configuration of the multi-layer wiring ceramic package 300 in detail, which is omitted in FIGS. 17B and 17C.

As shown in FIGS. 18 and 19, the signal processing chip 200 is mounted, as in the case of the third embodiment, by the die-bonding material 720 on the bottommost surface S14 of the accommodation space SP1 serving as a die-attach surface. Further, there are a plurality of steps inside the accommodation space SP1, and the wire 820 is provided between the top surface S13 of one of the steps and the front surface of the signal processing chip 200 to electrically connect the top surface of the step and the front surface of the signal processing chip 200 to each other.

However, as shown in FIGS. 18 and 19, the intermediate plate 301 is provided, unlike the case of the third embodiment, on the top surface S12 of the step higher in level than the step where the wire 820 is provided inside the accommodation space SP1. That is, the intermediate plate 301 is provided on the second step of the accommodation space SP1. The intermediate plate 301 is bonded by a die bonding material 711 to the second step of the accommodation space SP1.

Further, as shown in FIGS. 18 and 19, the image sensor chip 100 is mounted by the die bonding material 710 on the top surface of the intermediate plate 301 serving as a die-attach surface. Furthermore, as shown in FIG. 19, the wire 810 is provided between the top surface S11 of the step higher in level than the step of the top surface of the intermediate plate 301 and the front surface of the image sensor chip 100 to electrically connect the top surface S11 and the front surface of the image sensor chip 100 to each other. Using the wire 810 formed of, for example Au, a pad electrode (not shown) provided on the top surface S11 of the step and the image sensor chip 100 are electrically connected to each other. That is, on the third step of the accommodation space SP1, the image sensor chip 100 is electrically connected to the multi-layer wiring ceramic package 300.

As described above, the intermediate plate 301 has its bottom surface bonded to the multi-layer wiring ceramic package 300 and its top surface bonded to the image sensor chip 100.

As shown in FIGS. 18 and 19, the low heat conduction layer 907 is interposed, as in the case of the third embodiment, between the image sensor chip 100 and the signal processing chip 200.

According to this embodiment, the low heat conduction layer 907 is provided, unlike the case of the third embodiment, inside the accommodation space SP1 to be held between the intermediate plate 301 and the signal processing chip 200.

In this embodiment, a ceramic substrate may be, for example, used as the intermediate plate 301.

As the intermediate plate 301, a substrate having lower heat conductivity than the ceramic layers C11 to C61 configuring the multi-layer wiring ceramic package 300 may be, for example, used. In this case, the heat from the heated signal processing chip 200 to the image sensing area PA of the image sensor chip 100 is insulated by the intermediate plate 301. Accordingly, because the heat of the signal processing chip 200 is unlikely to be transmitted to the image sensing area PA of the image sensor chip 100, the occurrence of a dark current may be appropriately reduced.

Besides, a substrate having higher heat conductivity than the ceramic layers C11 to C61 configuring the multi-layer wiring ceramic package 300 may be, for example, used as the intermediate plate 301. In this case, because the heat is likely to be transmitted to the intermediate plate 301, the transmitted heat may be appropriately radiated to the multi-layer wiring ceramic package 300. Accordingly, the occurrence of a dark current may be appropriately reduced.

(B) Summary

As described above, according to this embodiment, the low heat conduction layer 907 (air layer) is provided, as in the case of the third embodiment, to be interposed at the part where the image sensing area PA of the image sensor chip 100 and the signal processing chip 200 face each other. Therefore, the heat from the heated signal processing chip 200 to the image sensing area PA of the image sensor chip 100 is insulated by the low heat conduction layer 907 (air layer).

Besides, the heat of the surrounding area SA of the image sensor chip 100 may be radiated via the thick wiring layer H31.

Moreover, according to this embodiment, the multi-layer wiring ceramic package 300 accommodates the intermediate plate 301 inside the accommodation space SP1. Further, the image sensor chip 100 and the signal processing chip 200 are provided to overlap with each other via the intermediate plate 301 together with the low heat conduction layer 907 (air layer). Therefore, with adequate control of the heat conductivity of the intermediate plate 301, the heat may be insulated or radiated.

Thus, according to this embodiment, it is possible to reduce an increase in the temperature of the image sensing area PA and the occurrence of a dark current in the image sensor chip 100. Therefore, image quality of a captured image may be improved.

(5) Fifth Embodiment

(A) Configuration of Apparatus

Figure 20:
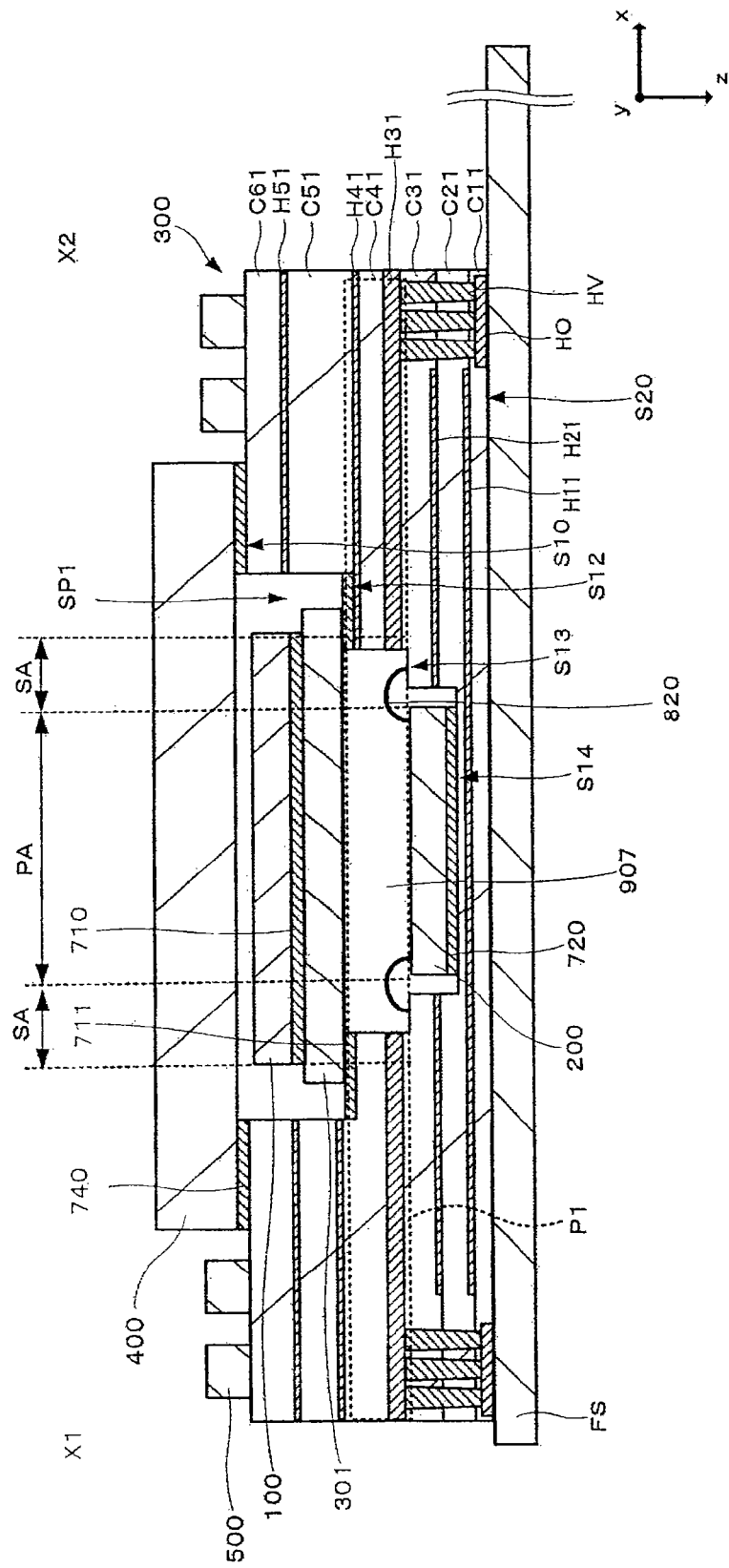
FIG. 20 is an enlarged view of a cross section of the solid-state image sensing apparatus according to a fifth embodiment.

FIG. 20 is an enlarged view of a cross section of the solid-state image sensing apparatus according to a fifth embodiment.

As with FIG. 18, FIG. 20 shows the cross section of the solid-state image sensing apparatus taken along the line X1-X2 in FIG. 17A.

As shown in FIG. 20, according to this embodiment, an outer lead HO and via holes HV are provided. Further, a flexible substrate FS is provided. Except for these points and relevant points, this embodiment is the same as the fourth embodiment. Therefore, descriptions of the duplicated parts will be omitted.

As shown in FIG. 20, the outer lead HO and the via holes HV are provided at the periphery of the multi-layer wiring ceramic package 300.

The outer lead HO is provided at the bottom surface of the multi-layer wiring ceramic package 300 as shown in FIG. 20 and formed of a metal conductive material.

As shown in FIG. 20, the via holes HV are provided between the wiring layer H31 and the outer lead HO. The wiring layer H31 is provided between the image sensor chip 100 and the signal processing chip 200. The plurality of via holes HV are provided to be arranged side by side between the wiring layer H31 and the outer lead HO. The via holes HV are formed of a metal conductive material and electrically connect the wiring layer H31 and the outer lead HO to each other.

The flexible substrate FS is provided at the bottom surface of the multi-layer wiring ceramic package 300 where the outer lead HO is formed.

(B) Operations

Figure 21:
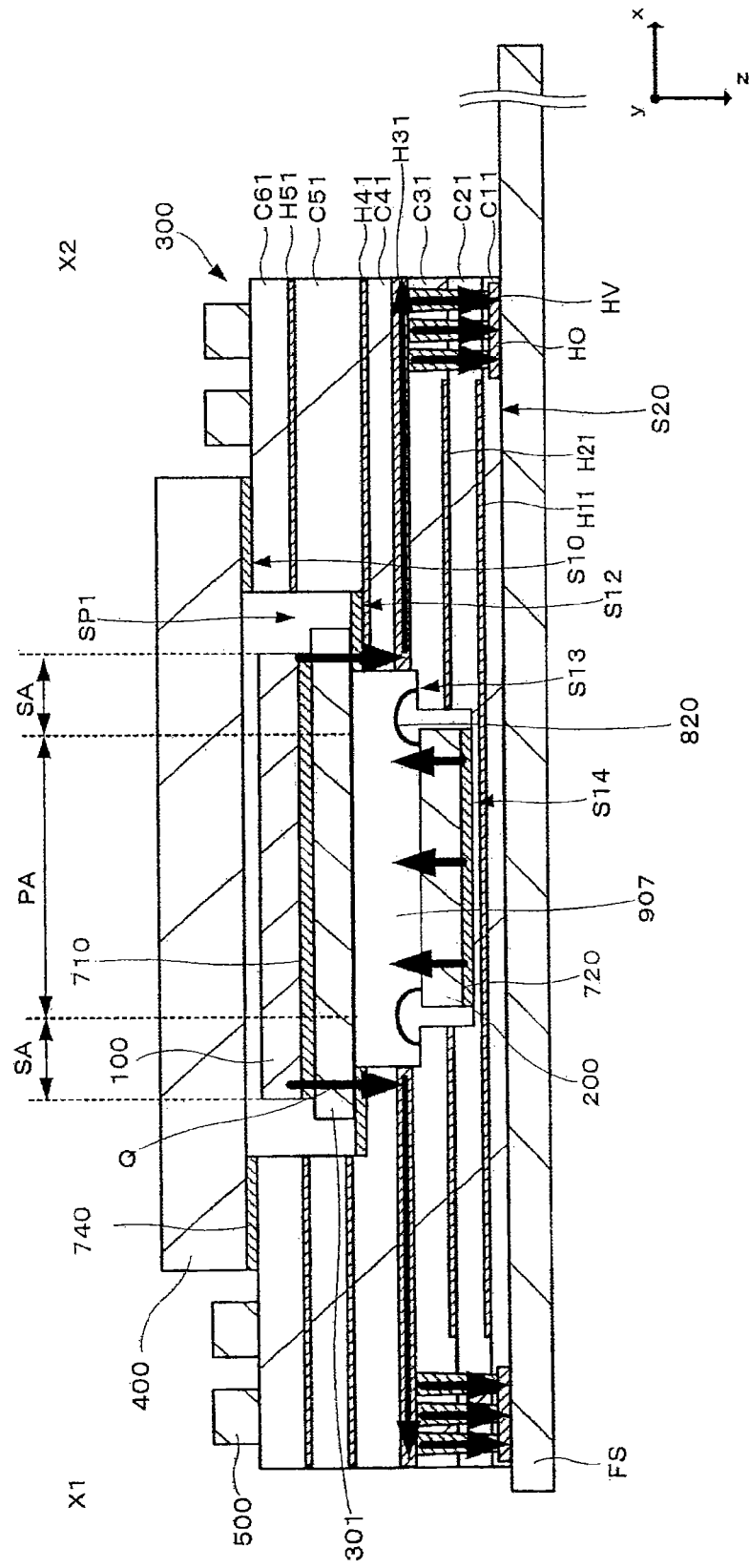
FIG. 21 is an enlarged view schematically showing heat transmission in the solid-state image sensing apparatus according to the fifth embodiment.

FIG. 21 is an enlarged view schematically showing heat transmission in the solid-state image sensing apparatus according to the fifth embodiment.

As described above, the transmission of the heat Q from the signal processing chip 200 to the image sensing area PA of the image sensor chip 100 may result in an increase in the temperature of the image sensing area PA of the image sensor chip 100 and significant degradation in dark current characteristics.

However, according to this embodiment, the low heat conduction layer 907 is provided, as shown in FIG. 21, at the part where the image sensing area PA of the image sensor chip 100 and the signal processing chip 200 face each other.

Because the low heat conduction layer 907 has lower heat conductivity than the ceramic layers C11 to C61 configuring the multi-layer wiring ceramic package 300, the heat Q from the signal processing chip 200 to the image sensing area PA of the image sensor chip 100 is insulated by the low heat conduction layer 907.

Further, the surrounding area SA of the image sensor chip 100 is bonded to the surface S12 of the multi-layer wiring ceramic package 300. Therefore, the heat Q of the surrounding area SA of the image sensor chip 100 is transmitted to the wiring layer H31. Then, the heat transmitted to the wiring layer H31 provided between the image sensor chip 100 and the signal processing chip 200 is transmitted to the outer lead HO via the via holes HV and radiated.

Because the wiring layer H31 according to this embodiment has a greater thickness than the other wiring layers, the heat Q may be radiated to the outside in a greater amount.

Thus, according to this embodiment, it is possible to reduce an increase in the temperature of the image sensing area PA of the image sensor chip 100.

(C) Summary

As described above, according to this embodiment, the low heat conduction layer 907 (air layer) is provided, as in the case of the fourth embodiment, to be interposed at the part where the image sensing area PA of the image sensor chip 100 and the signal processing chip 200 face each other. Therefore, the heat from the heated signal processing chip 200 to the image sensing area PA of the image sensor chip 100 is insulated by the low heat conduction layer 907 (air layer).

Besides, the heat of the surrounding area SA of the image sensor chip 100 may be radiated via the thick wiring layer H31.

Moreover, according to this embodiment, the multi-layer wiring ceramic package 300 has the outer lead HO, and the thick wiring layer H31 is connected to the outer lead HO. Therefore, the heat transmitted to the wiring layer H31 is transmitted to the outer lead HO and effectively radiated to the outside.

Thus, according to this embodiment, it is possible to reduce an increase in the temperature of the image sensing area PA and the occurrence of a dark current in the image sensor chip 100. Therefore, image quality of a captured image may be improved.

(6) Sixth Embodiment

(A) Configuration of Apparatus

Figure 22:
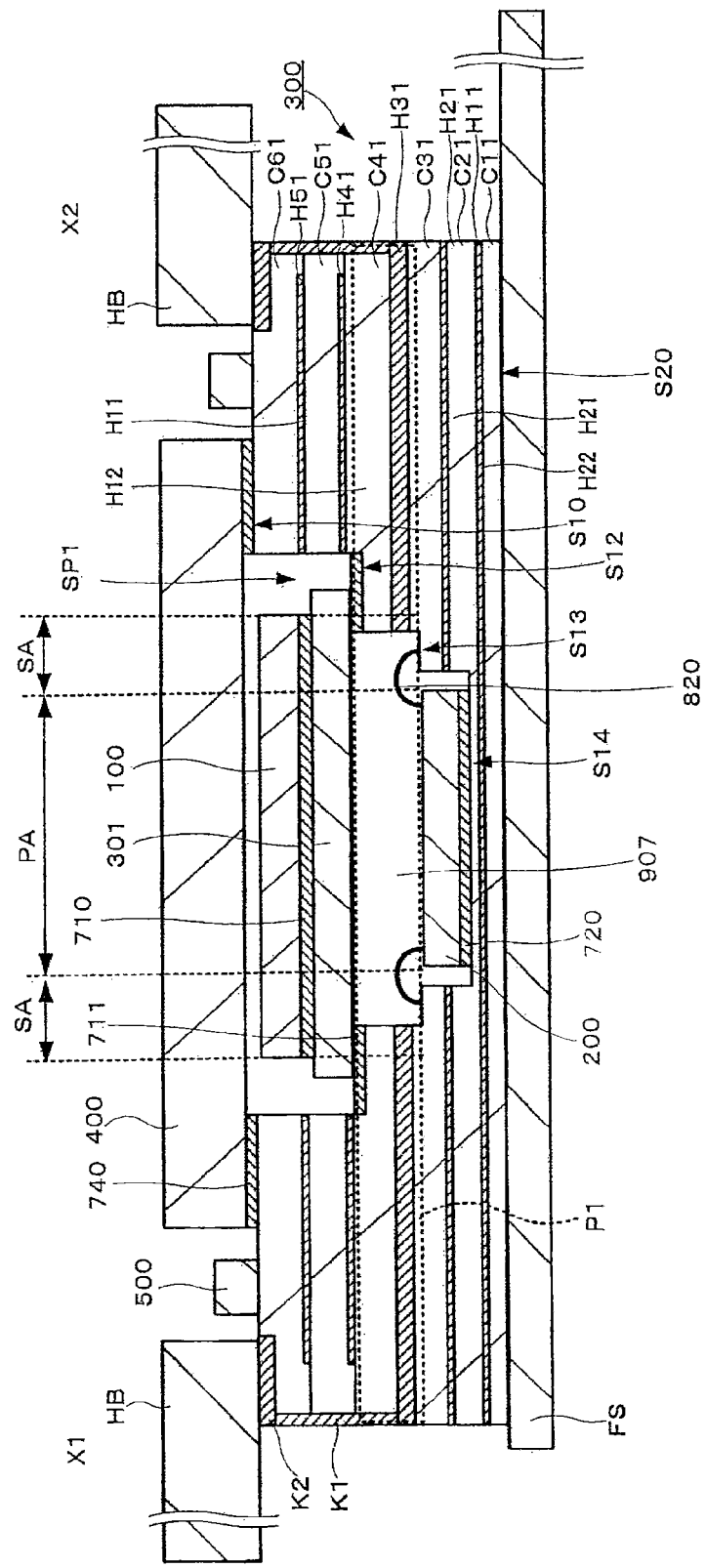
FIG. 22 is an enlarged view of a cross section of the solid-state image sensing apparatus according to a sixth embodiment.

FIG. 22 is an enlarged view of a cross section of the solid-state image sensing apparatus according to a sixth embodiment.

As with FIG. 18, FIG. 22 shows the cross section of the solid-state image sensing apparatus taken along the line X1-X2 in FIG. 17A.

As shown in FIG. 22, according to this embodiment, metal layers K1 and K2 and a radiation member HB are provided. Further, the flexible substrate FS is provided. Except for these points and relevant points, this embodiment is the same as the fourth embodiment. Therefore, descriptions of the duplicated parts will be omitted.

As shown in FIG. 22, the metal layers K1 and K2 are provided at the periphery of the multi-layer wiring ceramic package 300. As with the wiring layers H11 to H51 configuring the multi-layer wiring ceramic package 300, the metal layers K1 and K2 are formed of a metal conductive material.

Among them, as shown in FIG. 22, the metal layer K1 is provided above the part where the wiring layer H31 is provided at the lateral surface of the multi-layer wiring ceramic package 300. The metal layer K1 provided at the lateral surface is formed to have its lower end connected to the wiring layer H31.

On the other hand, as shown in FIG. 22, the metal layer K2 is provided at the top surface and the lateral end of the multi-layer wiring ceramic package 300. The metal layer K2 provided at the top surface is formed to be connected to the upper end of the metal layer K1 provided at the lateral surface.

Further, as shown in FIG. 22, the multi-layer wiring ceramic package 300 has the radiation member HB on its top surface. Here, the radiation member HB is arranged to be held in contact with the top surface of the metal layer K2 provided at the top surface of the multi-layer wiring ceramic package 300. The radiation member HB is, for example, a heat sink and formed of a metal conductive material such as Al and Cu.

Further, as shown in FIG. 22, the multi-layer wiring ceramic package 300 has the flexible substrate FS at its bottom surface.

(B) Operations

Figure 23:
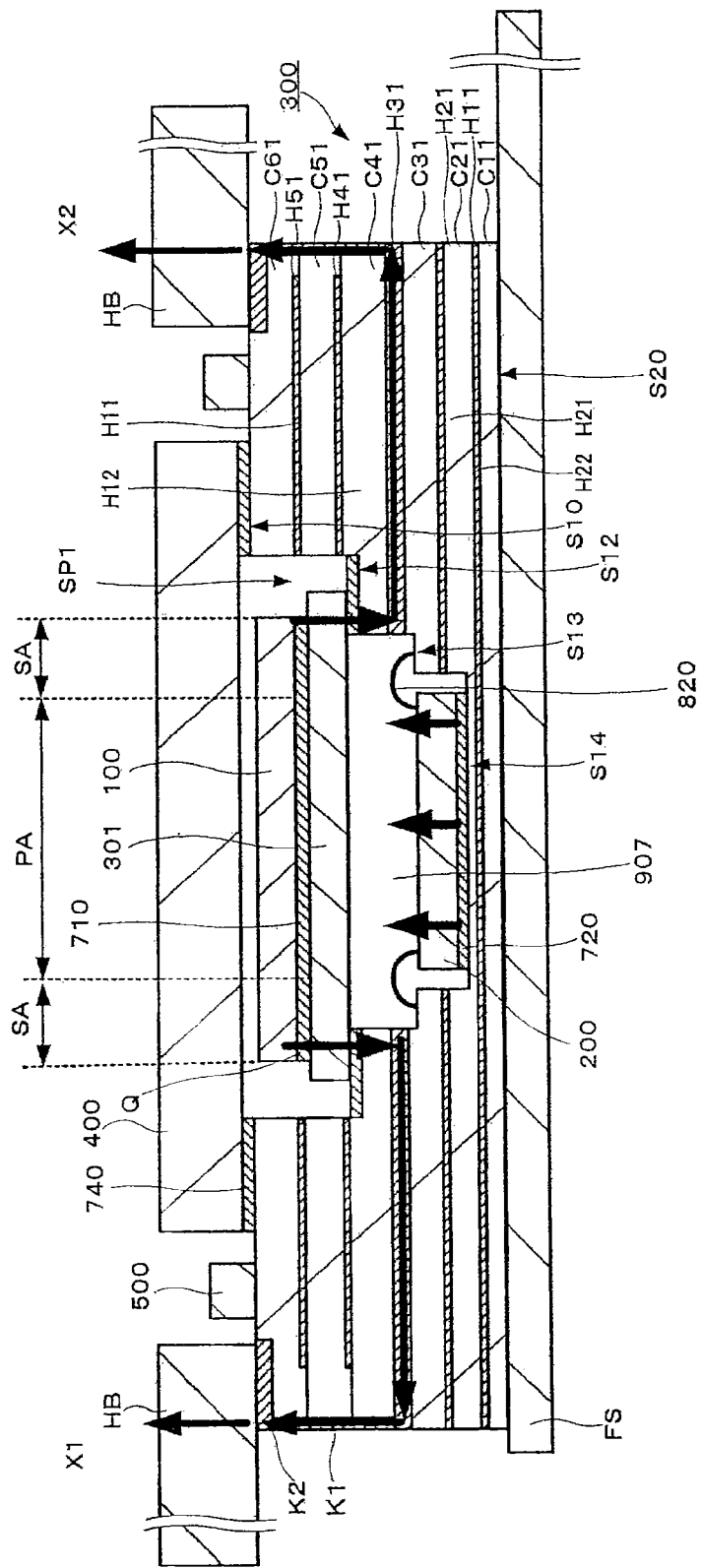
FIG. 23 is an enlarged view schematically showing heat transmission in the solid-state image sensing apparatus according to the sixth embodiment.

FIG. 23 is an enlarged view schematically showing heat transmission in the solid-state image sensing apparatus according to the sixth embodiment.

As described above, the transmission of the heat Q from the signal processing chip 200 to the image sensing area PA of the image sensor chip 100 may result in an increase in the temperature of the image sensing area PA of the image sensor chip 100 and significant degradation in dark current characteristics.

However, according to this embodiment, the low heat conduction layer 907 is provided, as shown in FIG. 23, at the part where the image sensing area PA of the image sensor chip 100 and the signal processing chip 200 face each other.

Because the low heat conduction layer 907 has lower heat conductivity than the ceramic layers C11 to C61 configuring the multi-layer wiring ceramic package 300, the heat Q from the signal processing chip 200 to the image sensing area PA of the image sensor chip 100 is insulated by the low heat conduction layer 907.

Further, the surrounding area SA of the image sensor chip 100 is bonded to the surface S12 of the multi-layer wiring ceramic package 300. Therefore, the heat Q of the surrounding area SA is transmitted to the wiring layer H31. Then, the heat transmitted to the wiring layer H31 provided between the image sensor chip 100 and the signal processing chip 200 is transmitted to the radiation member HB via the metal layers K1 and K2 and radiated.

Because the wiring layer H31 according to this embodiment has a greater thickness than the other wiring layers, the heat Q may be radiated to the outside in a greater amount.

Thus, according to this embodiment, it is possible to reduce an increase in the temperature of the image sensing area PA of the image sensor chip 100.

(C) Summary

As described above, according to this embodiment, the low heat conduction layer 907 (air layer) is provided, as in the case of the fourth embodiment, to be interposed at the part where the image sensing area PA of the image sensor chip 100 and the signal processing chip 200 face each other. Therefore, the heat from the heated signal processing chip 200 to the image sensing area PA of the image sensor chip 100 is insulated by the low heat conduction layer 907 (air layer).

Besides, the heat of the surrounding area SA of the image sensor chip 100 may be radiated via the thick wiring layer H31.

Moreover, according to this embodiment, the multi-layer wiring ceramic package 300 has the metal layers K1 and K2 at its outer surface, and the thick wiring layer H31 is connected to the metal layers K1 and K2. Further, the radiation member HB is provided to be held in contact with the metal layer K2. Therefore, the heat transmitted to the wiring layer H31 is transmitted to the radiation member HB via the metal layers K1 and K2 and effectively radiated to the outside.

Thus, according to this embodiment, it is possible to reduce an increase in the temperature of the image sensing area PA and the occurrence of a dark current in the image sensor chip 100. Therefore, image quality of a captured image may be improved.

(7) Other

The implementation of the present disclosure is not limited to the above embodiments, but various modifications may be employed.

The above embodiments include, but are not limited to, a case where a CCD imaging sensor chip is used as the image sensor chip 100. For example, the above embodiments may be applied to a case where a CMOS imaging sensor chip is used as the image sensor chip 100.

The above embodiments include, but are not limited to, a case where the present disclosure is applied to a camera. For example, the present disclosure may be applied to other electronic apparatuses including a solid-state image sensing apparatus such as a scanner and a copier.

Further, the relationship of the size between the image sensor chip 100 and the signal processing chip 200 is not limited to the above embodiments. For example, the image sensor chip 100 and the signal processing chip 200 may be different or the same in size.

The above embodiments include, but are not limited to, a case where the wiring layers H11 to H51 are provided between the plurality of ceramic layers C11 to C61, respectively. For example, the multi-layer wiring package may be configured, instead of the ceramic layers C11 to C61, using insulation layers formed of an organic insulation material.

Further, the above embodiments include, but are not limited to, a case where the wiring layer H31 positioned between the image sensor chip 100 and the signal processing chip 200 is grounded. For example, the wiring layer H31 may serve as a wiring other than a ground wiring like the other wiring layers H11, H21, H41, and H51.

Further, in a case where the heat is radiated via the outer lead HO in the fifth embodiment, the outer lead HO favorably has a greater surface area in its surface exposed to the outside.

Figure 24:
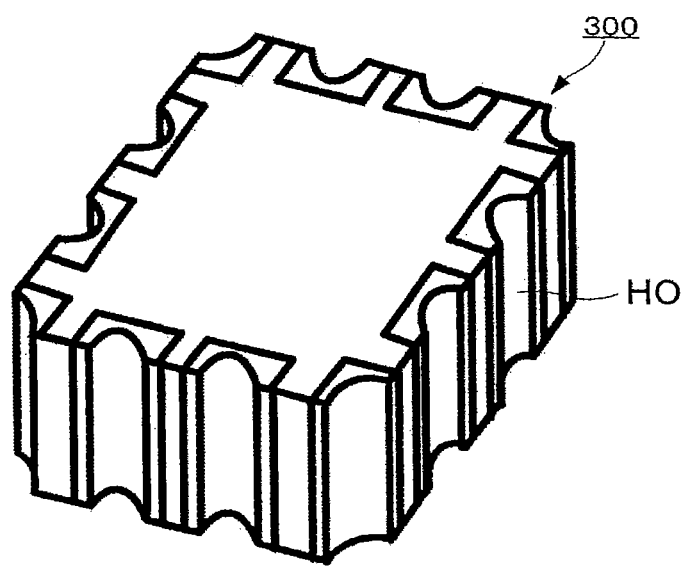
FIG. 24 is a perspective view showing a multi-layer wiring ceramic package.

FIG. 24 is a perspective view showing the multi-layer wiring ceramic package. In FIG. 24, the above accommodation spaces and the like are omitted.

As shown in FIG. 24, the multi-layer wiring ceramic package 300 has arc-shaped dents at its lateral surface. The outer lead HO is provided to fit in the arc-shaped dents at its surface exposed to the outside. That is, the outer lead HO is formed to have a castellation structure. It is favorable to form the outer lead HO into such a structure because the outer lead HO has a greater front area in its surface exposed to the outside.

Moreover, the above embodiments may be combined together if necessary.

Note that the present disclosure may employ the following configurations.

(1) A solid-state image sensing apparatus, including:

a solid-state image sensing device having a pixel in an image sensing area thereof, the pixel being configured to receive incident light and generate a signal electric charge;

a signal processing circuit device arranged to face the image sensing area of the solid-state image sensing device and configured to apply signal processing to a signal output from the solid-state image sensing device; and a multi-layer wiring package having a plurality of wiring layers provided therein and having the solid-state image sensing device and the signal processing circuit device provided therein, each of the plurality of the wiring layers being laminated via an insulator, in which the multi-layer wiring package is formed such that a first wiring layer provided between the solid-state image sensing device and the signal processing circuit device among the plurality of wiring layers has a greater thickness than second wiring layers other than the first wiring layer, and the first wiring layer has heat conductivity higher than or equal to heat conductivity of the second wiring layers.

(2) A solid-state image sensing apparatus, including:

a solid-state image sensing device having a pixel in an image sensing area thereof, the pixel being configured to receive incident light and generate a signal electric charge;

a signal processing circuit device arranged to face the image sensing area of the solid-state image sensing device and configured to apply signal processing to a signal output from the solid-state image sensing device; and a multi-layer wiring package having a plurality of wiring layers provided therein and having the solid-state image sensing device and the signal processing circuit device provided therein, each of the plurality of the wiring layers being laminated via an insulator, in which the multi-layer wiring package is formed such that a first wiring layer provided between the solid-state image sensing device and the signal processing circuit device among the plurality of wiring layers has a thickness greater than or equal to a thickness of second wiring layers other than the first wiring layer, and the first wiring layer has higher heat conductivity than the second wiring layers.

(3) The solid-state image sensing apparatus as described in Item (2), in which the first wiring layer and the second wiring layers are the same in thickness.

(4) The solid-state image sensing apparatus as described in any of Items (1) to (3), in which the solid-state image sensing device is provided inside a first accommodation space formed on a side of one surface of the multi-layer wiring package, the signal processing circuit device is provided inside a second accommodation space formed on a side of the other surface opposite to the one surface where the solid-state image sensing device is provided in the multi-layer wiring package, and the multi-layer wiring package has the first wiring layer to be interposed between the first accommodation space and the second accommodation space and has the second wiring layers at lateral parts of the first accommodation space and the second accommodation space.

(5) The solid-state image sensing apparatus as described in any of Items (1) to (4), in which the multi-layer wiring package has an accommodation space at one surface thereof, the solid-state image sensing device and the signal processing circuit device are laminated together via an air layer inside the accommodation space, and the first wiring layer is provided at a lateral part of the air layer.

(6) The solid-state image sensing apparatus as described in Item (5), in which the multi-layer wiring package is configured to accommodate an intermediate plate inside the accommodation space, and the solid-state image sensing device and the signal processing circuit device are laminated together via the intermediate plate together with the air layer.

(7) The solid-state image sensing apparatus as described in any of Items (1) to (6), in which the multi-layer wiring package has an outer lead, and the first wiring layer is connected to the outer lead.

(8) The solid-state image sensing apparatus as described in any of Items (1) to (6), in which the multi-layer wiring package has a metal layer at an outer surface thereof, the first wiring layer is connected to the metal layer, and a radiation member is provided to be held in contact with the metal layer.

(9) The solid-state image sensing apparatus as described in any of Items (1) to (8), in which the first wiring layer is a ground wiring.

(10) An electronic apparatus, including:

a solid-state image sensing device having a pixel in an image sensing area thereof, the pixel being configured to receive incident light and generate a signal electric charge;

a signal processing circuit device arranged to face the image sensing area of the solid-state image sensing device and configured to apply signal processing to a signal output from the solid-state image sensing device; and a multi-layer wiring package having a plurality of wiring layers provided therein and having the solid-state image sensing device and the signal processing circuit device provided therein, each of the plurality of the wiring layers being laminated via an insulator, in which the multi-layer wiring package is formed such that a first wiring layer provided between the solid-state image sensing device and the signal processing circuit device among the plurality of wiring layers has a greater thickness than second wiring layers other than the first wiring layer, and the first wiring layer has heat conductivity higher than or equal to heat conductivity of the second wiring layers.

(11) An electronic apparatus, including:

a solid-state image sensing device having a pixel in an image sensing area thereof, the pixel being configured to receive incident light and generate a signal electric charge;

a signal processing circuit device arranged to face the image sensing area of the solid-state image sensing device and configured to apply signal processing to a signal output from the solid-state image sensing device; and a multi-layer wiring package having a plurality of wiring layers provided therein and having the solid-state image sensing device and the signal processing circuit device provided therein, each of the plurality of the wiring layers being laminated via an insulator, in which the multi-layer wiring package is formed such that a first wiring layer provided between the solid-state image sensing device and the signal processing circuit device among the plurality of wiring layers has a thickness greater than or equal to a thickness of second wiring layers other than the first wiring layer, and the first wiring layer has higher heat conductivity than the second wiring layers.

Note that in the above embodiments, the image sensor chip 100 is an example of a solid-state image sensing device according to the present disclosure. Further, the camera 40 is an example of an electronic apparatus according to the present disclosure. Further, the solid-state image sensing apparatus 1 is an example of a solid-state image sensing apparatus according to the present disclosure. Further, the signal processing chip 200 is an example of a signal processing circuit device according to the present disclosure. Further, the multi-layer wiring ceramic package 300 is an example of a multi-layer wiring package according to the present disclosure. Further, the intermediate plate 301 is an example of an intermediate plate according to the present disclosure. Further, the low heat conduction layer 907 is an example of an air layer according to the present disclosure. Further, the ceramic layers C11 to C61 are an example of an insulator according to the present disclosure. Further, the wiring layers H11 to H51 are an example of a wiring layer according to the present disclosure. Further, the wiring layers H11, H21, H41, H51 are an example of a second wiring layer according to the present disclosure. Further, the wiring layer H31 is an example of a first wiring layer according to the present disclosure. Further, the radiation member HB is an example of a radiation member according to the present disclosure. Further, the outer lead HO is an example of an outer lead according to the present disclosure. Further, the metal layers K1 and K2 are an example of a metal layer according to the present disclosure. Further, the pixels P are an example of a pixel according to the present disclosure. Further, the image sensing area PA is an example of an image sensing area according to the present disclosure. Further, the accommodation space SP1 is an example of a first accommodation space according to the present disclosure. Further, the accommodation space SP2 is an example of a second accommodation space according to the present disclosure.

The present disclosure contains subject matter related to that disclosed in Japanese Priority Patent Application JP 2011-151173 filed in the Japan Patent Office on Jul. 7, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image apparatus, comprising:
   a solid-state image circuit configured to generate a signal electric charge by receiving incident light;
   a signal processing circuit positioned on a surface of the solid-state image circuit and configured to process an image signal output from the solid-state image circuit; and
   a multi-layer wiring package including the solid-state image circuit, the signal processing circuit, a first wiring layer, and a second wiring layer, wherein
   the first wiring layer has heat conductivity higher than or equal to heat conductivity of the second wiring layer, and
   the first wiring layer is a ground wiring.

2. The solid-state image apparatus according to claim 1, wherein
   the first wiring layer and the second wiring layer have a same thickness.

3. The solid-state image apparatus according to claim 1, wherein
   the solid-state image circuit is provided inside a first accommodation space formed on a side of one surface of the multi-layer wiring package,
   the signal processing circuit is provided inside a second accommodation space formed on a side of an other surface opposite to the one surface where the solid-state image circuit is provided in the multi-layer wiring package, and
   the multi-layer wiring package has the first wiring layer interposed between the first accommodation space and the second accommodation space and has the second wiring layer at lateral parts of the first accommodation space and the second accommodation space.

4. The solid-state image apparatus according to claim 1, wherein
   the multi-layer wiring package has an accommodation space at one surface thereof,
   the solid-state image circuit and the signal processing circuit are laminated together via an air layer inside the accommodation space, and
   the first wiring layer is provided at a lateral part of the air layer.

5. The solid-state image apparatus according to claim 4, wherein
   the multi-layer wiring package is configured to accommodate an intermediate plate inside the accommodation space, and
   the solid-state image circuit and the signal processing circuit are laminated together via the intermediate plate together with the air layer.

6. The solid-state image apparatus according to claim 1, wherein
   the multi-layer wiring package has an outer lead, and
   the first wiring layer is connected to the outer lead.

7. The solid-state image apparatus according to claim 1, wherein
   the multi-layer wiring package has a metal layer at an outer surface thereof,
   the first wiring layer is connected to the metal layer, and
   a radiation member is provided to be held in contact with the metal layer.

8. The solid-state image apparatus according to claim 1, wherein the first wiring layer is disposed between the solid-state image circuit and the signal processing circuit.

9. An electronic apparatus, comprising:
   a solid-state image circuit configured to generate a signal electric charge by receiving incident light;
   a signal processing circuit positioned on a surface of the solid-state image circuit and configured to process an image signal output from the solid-state image circuit; and
   a multi-layer wiring package including the solid-state image circuit, the signal processing circuit, a first wiring layer and a second wiring layer, wherein
   the first wiring layer has heat conductivity higher than or equal to heat conductivity of the second wiring layer, and
   the first wiring layer is a ground wiring.

10. The electronic apparatus according to claim 9, wherein the first wiring layer and the second wiring have a same thickness.

11. The electronic apparatus according to claim 9, wherein
    the solid-state image circuit is provided inside a first accommodation space formed on a side of one surface of the multi-layer wiring package, the signal processing circuit is provided inside a second accommodation space formed on a side of an other surface opposite to the one surface where the solid-state image circuit is provided in the multi-layer wiring package, and the multi-layer wiring package has the first wiring layer interposed between the first accommodation space and the second accommodation space and has the second wiring layer at lateral parts of the first accommodation space and the second accommodation space.

12. The electronic apparatus according to claim 9, wherein
the multi-layer wiring package has an accommodation space at one surface thereof,
the solid-state image circuit and the signal processing circuit are laminated together via an air layer inside the accommodation space, and
the first wiring layer is provided at a lateral part of the air layer.

13. The electronic apparatus according to claim 12, wherein
the multi-layer wiring package is configured to accommodate an intermediate plate inside the accommodation space, and
the solid-state image circuit and the signal processing circuit are laminated together via the intermediate plate together with the air layer.

14. The electronic apparatus according to claim 9, wherein
the multi-layer wiring package has an outer lead, and
the first wiring layer is connected to the outer lead.

15. The electronic apparatus according to claim 9, wherein
the multi-layer wiring package has a metal layer at an outer surface thereof,
the first wiring layer is connected to the metal layer, and
a radiation member is provided to be held in contact with the metal layer.

16. The electronic apparatus according to claim 9, wherein the first wiring layer is disposed between the solid-state image circuit and the signal processing circuit.

17. A solid-state image apparatus, comprising:
a solid-state image circuit configured to generate a signal electric charge by receiving incident light;
a signal processing circuit positioned on a surface of the solid-state image circuit and configured to process an image signal output from the solid-state image circuit; and
a multi-layer wiring package including the solid-state image circuit, the signal processing circuit, a first wiring layer, and a second wiring layer, wherein
the first wiring layer has heat conductivity higher than or equal to heat conductivity of the second wiring layer, and
the first wiring layer and the second wiring layer have a same thickness.

18. The solid-state image apparatus according to claim 17, wherein the first wiring layer is disposed between the solid-state image circuit and the signal processing circuit.

* * * * *